(12) United States Patent
Tajima

(10) Patent No.: US 12,156,379 B2
(45) Date of Patent: Nov. 26, 2024

(54) SEMICONDUCTOR STORAGE DEVICE

(71) Applicant: KIOXIA CORPORATION, Tokyo (JP)

(72) Inventor: Seiichi Tajima, Nagareyama Chiba (JP)

(73) Assignee: Kioxia Corporation, Tokyo (JP)

( * ) Notice: Subject to any disclaimer, the term of this patent is extended or adjusted under 35 U.S.C. 154(b) by 377 days.

(21) Appl. No.: 17/841,377

(22) Filed: Jun. 15, 2022

(65) Prior Publication Data

US 2023/0240049 A1    Jul. 27, 2023

(30) Foreign Application Priority Data

Jan. 24, 2022    (JP) ................................ 2022-008698

(51) Int. Cl.
  *H05K 7/20*        (2006.01)
  *G06F 1/20*        (2006.01)
(52) U.S. Cl.
  CPC ........... *H05K 7/20409* (2013.01); *G06F 1/20* (2013.01); *H05K 7/2039* (2013.01)
(58) Field of Classification Search
  CPC ..... H05K 7/20409; H05K 7/2039; G06F 1/20
  USPC ....................................................... 361/703
  See application file for complete search history.

(56) References Cited

U.S. PATENT DOCUMENTS

| | | | |
|---|---|---|---|
| 10,966,345 B2 | 3/2021 | Chen et al. | |
| 2012/0268890 A1* | 10/2012 | Stock | G06F 1/20 361/679.53 |
| 2013/0027889 A1* | 1/2013 | Macall | H01L 23/4006 361/720 |
| 2017/0112018 A1* | 4/2017 | Krivonak | H05K 7/20927 |
| 2018/0184537 A1* | 6/2018 | Wang | H05K 1/189 |
| 2020/0375064 A1* | 11/2020 | Chen | H05K 7/20172 |
| 2021/0092871 A1* | 3/2021 | Hur | H05K 7/20163 |

FOREIGN PATENT DOCUMENTS

WO    2015/198642 A1    4/2017

\* cited by examiner

*Primary Examiner* — Zhengfu J Feng
(74) *Attorney, Agent, or Firm* — Maier & Maier, PLLC

(57) ABSTRACT

A semiconductor storage device according to an embodiment includes a housing, a board, a semiconductor memory component, a controller, and a heat-dissipation structure. The heat-dissipation structure includes a plurality of first heat-dissipation fins, a plurality of second heat-dissipation fins, and a first cover portion. The plurality of the first heat-dissipation fins are on a first region of the housing. The plurality of the second heat-dissipation fins are on a second region of the housing. The first cover portion is between the plurality of the first heat-dissipation fins and the plurality of the second heat-dissipation fins, or the first cover portion is at a gap between the second heat-dissipation fins. The first cover portion covers at least a part of the gap between the second heat-dissipation fins.

17 Claims, 19 Drawing Sheets

SEMICONDUCTOR STORAGE DEVICE

CROSS-REFERENCE TO RELATED APPLICATION

This application is based upon and claims the benefit of priority from Japanese Patent Application No. 2022-008698, filed Jan. 24, 2022, the entire contents of which are incorporated herein by reference.

FIELD

Embodiments described herein relate generally to a semiconductor storage device.

BACKGROUND ART

A semiconductor storage device including a housing, a board accommodated in the housing, a semiconductor memory component mounted on the board, and a controller mounted on the board is known.

DETAILED DESCRIPTION

Figure 1:
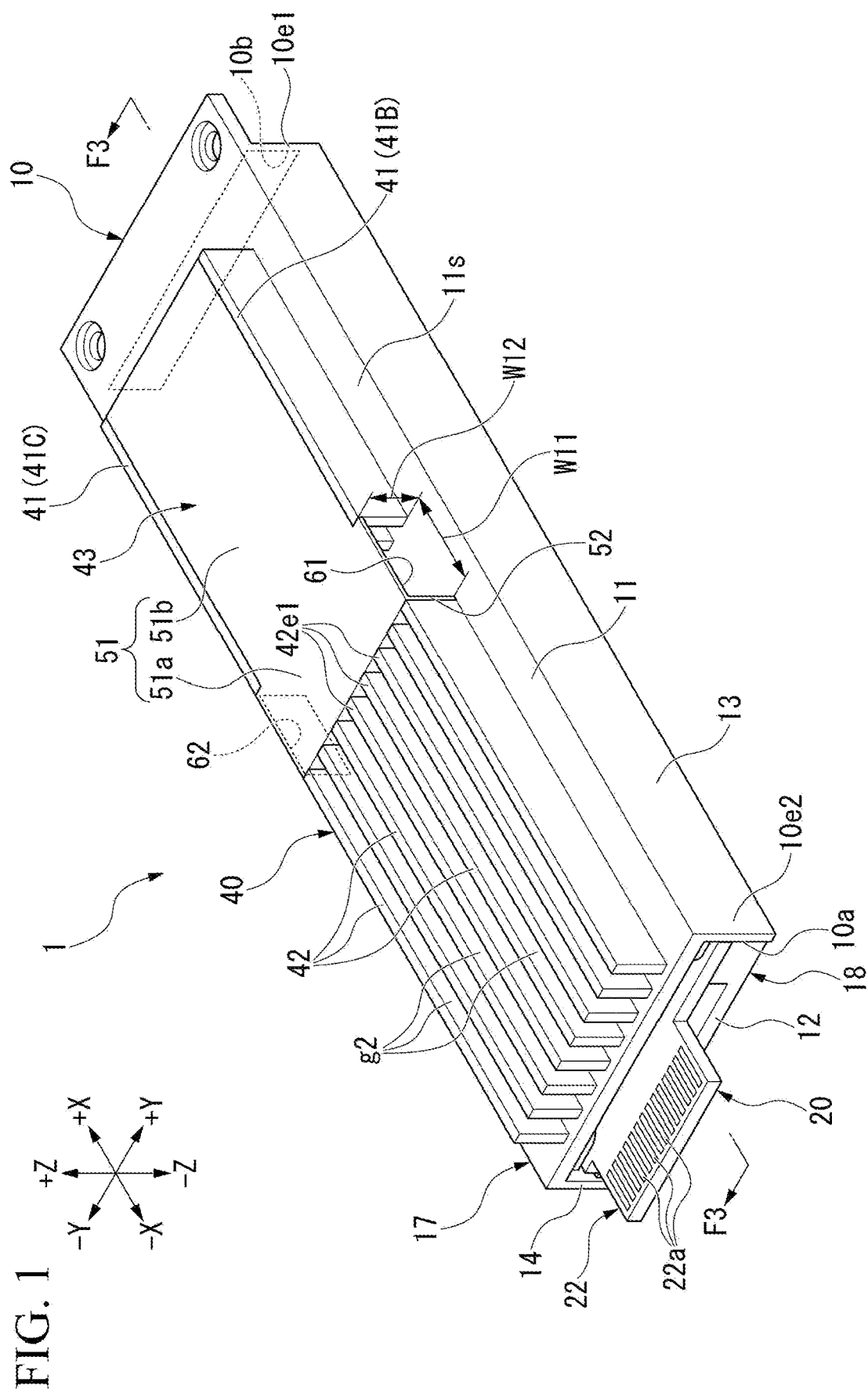
FIG. 1 is a perspective view showing a semiconductor storage device according to a first embodiment.

In general, according to an embodiment, a semiconductor storage device according to an embodiment includes a housing, a board, a semiconductor memory component, a controller, and a heat-dissipation structure. The board is in the housing. The semiconductor memory component is on the board. The controller is on the board. The controller is configured to control the semiconductor memory component. The heat-dissipation structure is on the housing. The heat-dissipation structure is exposed to an outside of the housing. The housing has a first region and a second region. The first region overlaps the semiconductor memory component in a first direction. The first direction is a thickness direction of the board. The second region overlaps the controller in the first direction. The heat-dissipation structure includes a plurality of first heat-dissipation fins, a plurality of second heat-dissipation fins, and a first cover portion. The plurality of the first heat-dissipation fins are on the first region. Each of the plurality of the first heat-dissipation fins extends in a second direction from the semiconductor memory component to the controller. The plurality of the second heat-dissipation fins are on the second region. The plurality of the second heat-dissipation fins are apart from the plurality of the first heat-dissipation fins in the second direction. Each of the plurality of the second heat-dissipation fins extends in the second direction. The first cover portion is between the plurality of the first heat-dissipation fins and the plurality of the second heat-dissipation fins, or the first cover portion is at a gap between the second heat-dissipation fins. The first cover portion covers at least a part of the gap between the second heat-dissipation fins when viewed from the second direction.

Hereinafter, a semiconductor storage device of embodiments will be described with reference to the drawings. In the following description, configurations having the same or similar functions will be designated by the same reference signs. Duplicate descriptions of such configurations may be omitted. In the present application, "parallel", "orthogonal", or "the same" each may include "substantially parallel", "substantially orthogonal", or "substantially the same", respectively. In the present application, "connection" is not limited to mechanical coupling and may include electrical coupling. Furthermore, "connection" is not limited to a case in which a plurality of members are directly connected to each other, but may also include a case in which a plurality of members are connected to each other with another member interposed therebetween. In the present application, "cover" means overlapping when viewed from one direction. Particularly, "a first member covers a second member" is not limited to a case in which the first member is in contact with the second member, but may also include a case in which the first member is apart from the second member and there is a space between the first member and the second member.

First, a +X direction, a −X direction, a +Y direction, a −Y direction, a +Z direction, and a −Z direction will be defined here. Each of the +X direction, the −X direction, the +Y direction, and the −Y direction is a direction parallel to a first surface S1 of a board 21 described below (refer to FIG. 2). The +X direction is a direction from a controller 23 to a first semiconductor memory component 24A on the board 21. Note that, in the present application, "direction from A to B" may include a case of "direction from a part of A to B". The −X direction is a direction opposite to the +X direction. The +X direction and the −X direction will be simply referred to as an "X direction" unless otherwise distinguished. The +Y direction and the −Y direction are directions intersecting with (for example, orthogonal to) the X direction. The +Y direction is a direction from a second side wall 14 of a housing 10 described below to a first side wall 13 (refer to FIG. 1). The −Y direction is a direction opposite to the +Y direction. The +Y direction and the −Y direction will be simply referred to as a "Y direction" unless otherwise distinguished.

Each of the +Z direction and the −Z direction is a direction crossing (for example, orthogonal to) the X direction and the Y direction and is a thickness direction of the board 21 described below (refer to FIG. 2). The +Z direction is a direction from the board 21 to a first main wall 11 of the housing 10 (refer to FIG. 2). The −Z direction is a direction opposite to the +Z direction. The +Z direction and the −Z direction will be simply referred to as a "Z direction" unless otherwise distinguished. The −Z direction is an example of a "first direction". The −X direction is an example of a "second direction". The +Y direction is an example of a "third direction".

First Embodiment

1. Overall Configuration of Semiconductor Storage Device

A semiconductor storage device 1 of a first embodiment will be described with reference to FIGS. 1 to 7. For example, the semiconductor storage device 1 is a storage device such as a solid state drive (SSD). For example, the semiconductor storage device 1 is configured to be attached to an information-processing apparatus such as a server or a personal computer and used as a storage of the information-processing apparatus. In the present application, the information-processing apparatus to which the semiconductor storage device 1 is configured to be attached will be referred to as a "host device".

FIG. 1 is a perspective view showing the semiconductor storage device 1. FIG. 2 is a partially exploded perspective view showing the semiconductor storage device 1. The semiconductor storage device 1 includes the housing 10, a board unit 20, a plurality of fixing members 30, and a heat-dissipation structure 40.

2. Housing

First of all, the housing 10 will be described. As shown in FIG. 1, the housing 10 is a member that forms an external shape of the semiconductor storage device 1. The housing 10 is made of, for example, metal. The shape of the housing 10 is a flat rectangular tube. The housing 10 includes the first main wall 11, a second main wall 12, the first side wall 13, and the second side wall 14.

The first main wall 11 is a wall portion located at the end portion on the side in the +Z direction of the housing 10. As shown in FIG. 2, the first main wall 11 is formed in a plate shape extending in the X direction and the Y direction. The first main wall 11 has a first region 11a and a second region 11b. The first region 11a is a region, for example, between the center CA of the first main wall 11 in the X direction and the end portion on the side in the +X direction of the first main wall 11. The first region 11a overlaps a plurality of semiconductor memory components 24 described below in the Z direction. The second region 11b is a region, for example, between the center CA of the first main wall 11 in the X direction and the end portion on the side in the −X direction of the first main wall 11. The second region 11b overlaps the controller 23 described below in the Z direction. Moreover, the first main wall 11 has an outer surface 11s. The outer surface 11s is a surface exposed to the outside of the housing 10. Note that the first region 11a and the second region 11b are not limited to the aforementioned example. For example, the first region 11a and the second region 11b may be located closer to one side in the +X direction than in the aforementioned example. For example, a part of the second region 11b may be located closer to the side in the +X direction than the center CA of the first main wall 11 in the X direction is.

As shown in FIG. 1, the second main wall 12 is a wall portion located at the end portion on the side in the −Z direction of the housing 10. The second main wall 12 is formed in a plate shape extending in the X direction and the Y direction.

The first side wall 13 is a wall portion located at the end portion on the side in the +Y direction of the housing 10. The first side wall 13 is formed in a plate shape extending in the X direction and the Z direction. The first side wall 13 connects the end portion on the side in the +Y direction of the first main wall 11 and the end portion on the side in the +Y direction of the second main wall 12.

The second side wall 14 is a wall portion located at the end portion on the side in the −Y direction of the housing 10. The second side wall 14 is formed in a plate shape extending in the X direction and the Z direction. The second side wall 14 connects the end portion on the side in the −Y direction of the first main wall 11 and the end portion on the side in the −Y direction of the second main wall 12.

The housing 10 has a first end portion 10e1 and a second end portion 10e2. The first end portion 10e1 is the end portion on the side in the +X direction. The first end portion 10e1 has an opening portion 10b. The opening portion 10b causes the inside of the housing 10 to be in communication with the outside of the housing 10. The opening portion 10b opens in the +X direction. On the other hand, the second end portion 10e2 is the end portion on the side in the −X direction. The second end portion 10e2 has an opening portion 10a. The opening portion 10a causes the inside of the housing 10 to be in communication with the outside of the housing 10. The opening portion 10a opens in the −X direction. A connector 22 described below is exposed to the outside of the housing 10 through the opening portion 10a.

Figure 2:
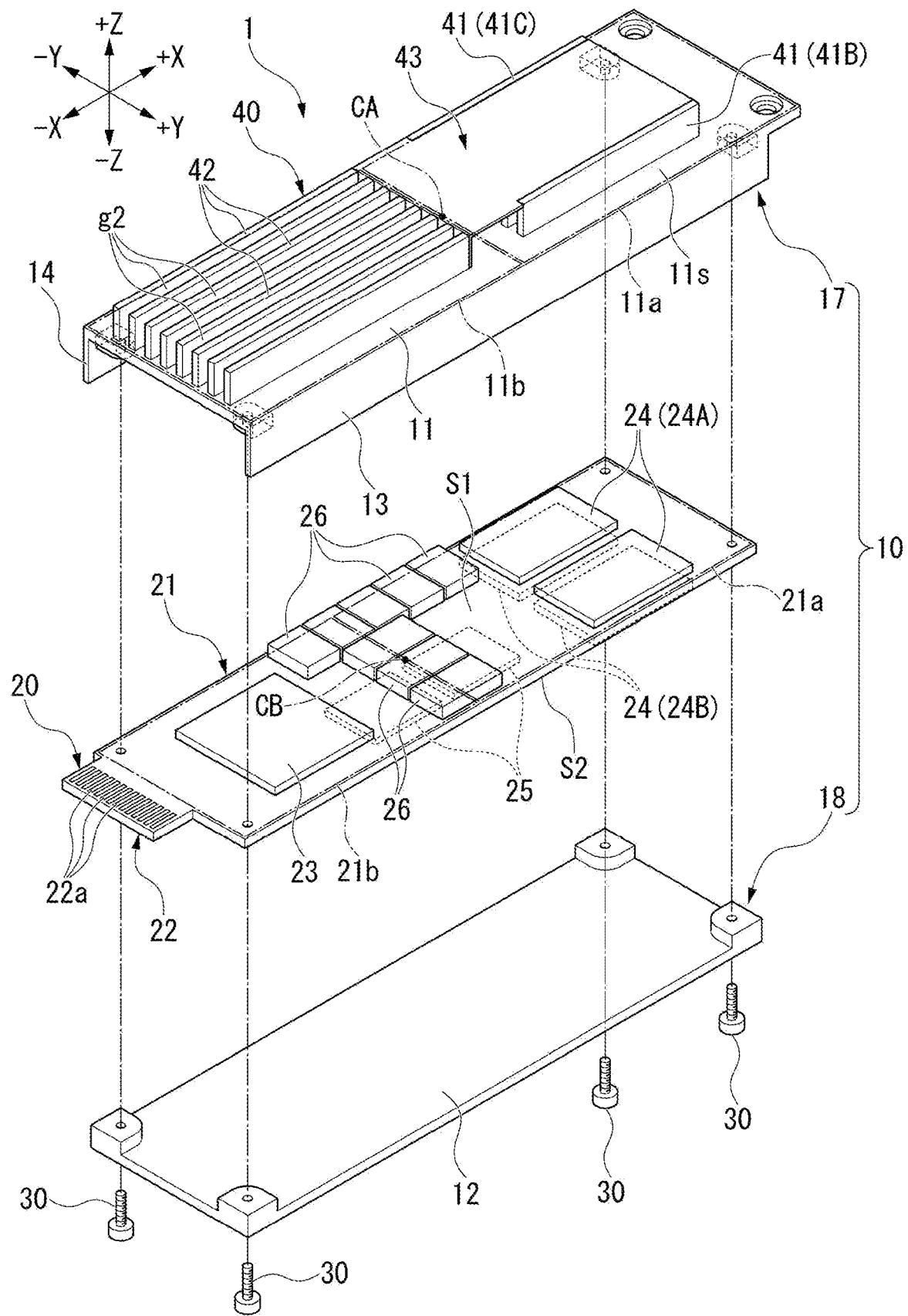
FIG. 2 is a partially exploded perspective view showing the semiconductor storage device according to the first embodiment.

As shown in FIG. 2, the housing 10 includes a first housing member 17 and a second housing member 18. The first housing member 17 includes the first main wall 11, the first side wall 13, and the second side wall 14. The second housing member 18 includes the second main wall 12. The first housing member 17 is coupled to the second housing member 18 by the plurality of fixing members 30.

2. Board Unit

Next, the board unit 20 will be described. The board unit 20 is an assembly on which devices including circuits are mounted. The board unit 20 is accommodated in the housing 10. The board unit 20 includes the board 21, the connector 22, the controller 23, the plurality of the semiconductor memory components 24, a plurality of dynamic random access memories (DRAMs) 25, a plurality of capacitors 26, and a plurality of heat connection members 27 (refer to FIG. 3).

The board 21 is a printed-wiring board. The board 21 includes an insulating base member and a wiring pattern provided on the insulating base member. As shown in FIG. 2, the board 21 has a plate shape along the X direction and the Y direction. The board 21 has a first region 21a and a second region 21b. The first region 21a is a region, for example, between the center CB of the board 21 in the X direction and the end portion on the side in the +X direction of the board 21. The second region 21b is a region, for example, between the center CB of the board 21 in the X direction and the end portion on the side in the −X direction of the board 21. The board 21 has the first surface S1 and a second surface S2. The first surface S1 is a surface directed to the +Z direction. The second surface S2 is located on the opposite side of the first surface S1. The second surface S2 is a surface directed to the −Z direction. Note that the first region 21a and the second region 21b are not limited to the aforementioned example. For example, the first region 21a and the second region 21b may be located closer to one side in the +X direction than in the aforementioned example. For example, a part of the second region 21b may be located closer to the side in the +X direction than the center CB of the board 21 in the X direction is.

The connector 22 is an electrical connection portion provided on the board 21. The connector 22 is provided at the end portion on the side in the −X direction of the board 21. The connector 22 is exposed to the outside of the housing 10 through the opening portion 10a of the second end portion 10e2 of the housing 10. The connector 22 includes a plurality of metal terminals 22a aligned in the Y direction. The connector 22 can be coupled to a connector of the host device.

The controller 23 is a control component (control device) mounted on the board 21. The controller 23 is configured to generally control the entire semiconductor storage device 1. For example, the controller 23 is configured to control writing of data, reading of data, or erasing of data with respect to the plurality of the semiconductor memory components 24. The controller 23 is mounted on the second region 21b of the board 21. The controller 23 is mounted on the first surface S1 of the board 21. The controller 23 is a device generating heat during operation. An amount of heat generation of the controller 23 is greater than the amount of heat generation of each of the semiconductor memory components 24.

Each of the semiconductor memory components 24 is, for example, a semiconductor package that includes a nonvolatile semiconductor memory chip. Each of the semiconductor memory components 24 is, for example, a NAND flash memory. Each of the semiconductor memory components 24 may be a NOR flash memory, a magnetoresistive random access memory (MRAM), a resistive random access memory (ReRAM), or the like. The plurality of the semiconductor memory components 24 are mounted on the first region 21a of the board 21. The plurality of the semiconductor memory components 24 include the plurality of first semiconductor memory components 24A and a plurality of second semiconductor memory components 24B. The plurality of the first semiconductor memory components 24A are mounted on the first surface S1 of the board 21. The plurality of the second semiconductor memory components 24B are mounted on the second surface S2 of the board 21. Each of the semiconductor memory components 24 is a device generating heat during operation.

Each of the DRAMs 25 is, for example, a semiconductor package that includes a volatile semiconductor memory chip. The DRAM 25 is used as a data buffer that temporarily stores write data received from the host device, read data read from one or more of the semiconductor memory components 24, or the like. The plurality of the DRAMs 25 are mounted on the second surface S2 of the board 21. However, one or all of the DRAMs 25 may be mounted on the first surface S1 of the board 21 instead of on the second surface S2 of the board 21.

Each of the capacitors 26 is a component configured to store electric charge and discharge the stored electric charge. The capacitor 26 has a power backup function for data protection when shut-off of electrical power unexpectedly happens. For example, when power supply from the host device to the semiconductor storage device 1 is unexpectedly shut off, the plurality of the capacitors 26 supply electrical power to the controller 23, the plurality of the semiconductor memory components 24, and the plurality of the DRAMs 25 for a predetermined time. The plurality of the capacitors 26 are mounted on the first surface S1 of the board 21. However, one or all of the capacitors 26 may be mounted on the second surface S2 of the board 21 instead of on the first surface S1 of the board 21. The plurality of the capacitors 26 are arranged so as to align in the X direction or the Y direction. The plurality of the capacitors 26 are disposed between the controller 23 and the plurality of the semiconductor memory components 24 in the X direction. The capacitor 26 is an example of an "electronic component". Note that an electronic component disposed between the controller 23 and the plurality of the semiconductor memory components 24 in the X direction is not limited to the capacitor 26. Another electronic component may be disposed between the controller 23 and the plurality of the semiconductor memory components 24.

Figure 3:
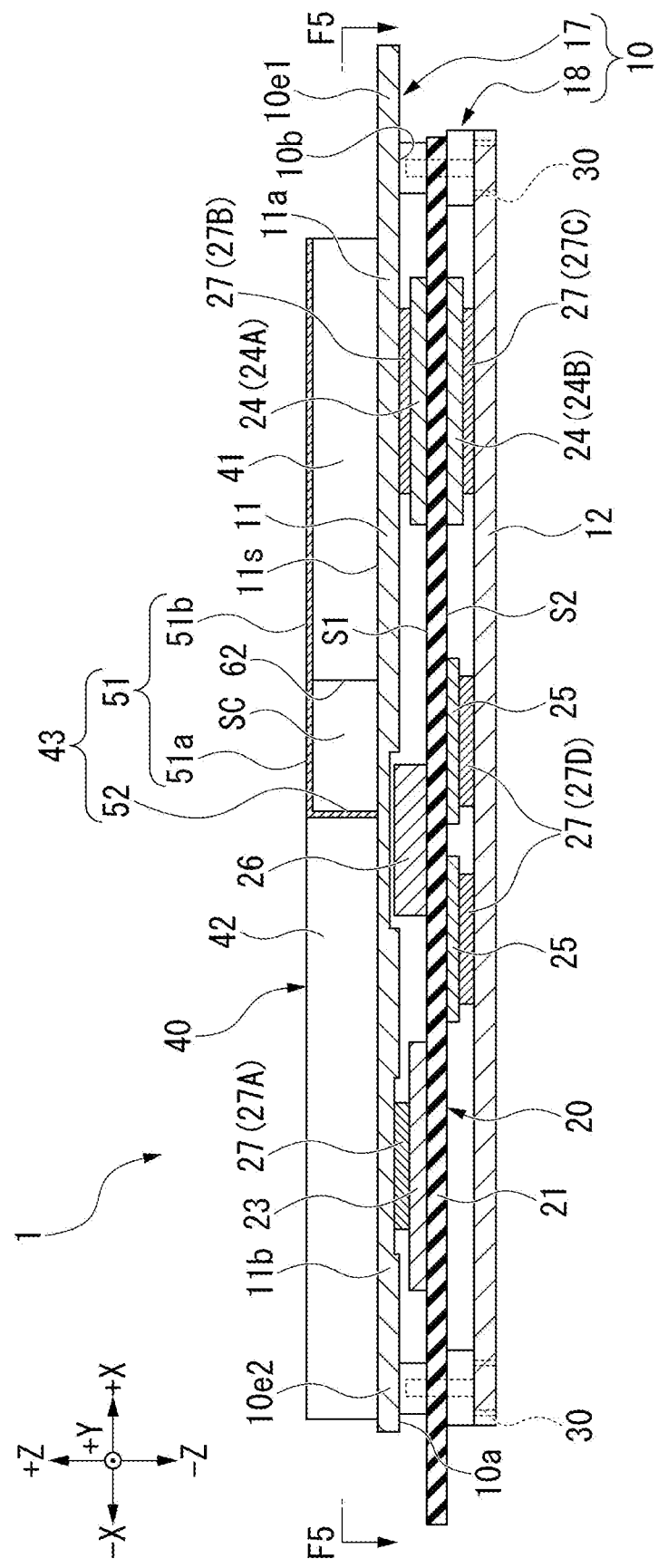
FIG. 3 is a cross-sectional view taken along line F3-F3 of the semiconductor storage device shown in FIG. 1.

FIG. 3 is a cross-sectional view taken along line F3-F3 of the semiconductor storage device 1 shown in FIG. 1.

The plurality of the heat connection members 27 includes material having a high degree of thermal conductivity. The heat connection members 27 are members that transfer heat between components. The heat connection members 27 include a first heat connection member 27A, a second heat connection member 27B, a third heat connection member 27C, and a fourth heat connection member 27D. The number of each of the first heat connection member 27A, the second heat connection member 27B, the third heat connection member 27C, and the fourth heat connection member 27D may be two or more.

The first heat connection member 27A is disposed between the controller 23 and the second region 11b of the first main wall 11 of the housing 10. The first heat connection member 27A transfers part of heat generated in the controller 23 to the second region 11b of the first main wall 11 of the housing 10.

The second heat connection members 27B are disposed between the first semiconductor memory components 24A and the first region 11a of the first main wall 11 of the housing 10. The second heat connection member 27B transfers part of heat generated in the plurality of the first semiconductor memory component 24A to the first region 11a of the first main wall 11 of the housing 10.

The third heat connection members 27C are disposed between the second semiconductor memory components 24B and the second main wall 12 of the housing 10. The third heat connection member 27C transfers part of heat generated in the plurality of the second semiconductor memory component 24B to the second main wall 12 of the housing 10.

The fourth heat connection members 27D are disposed between the DRAMs 25 and the second main wall 12 of the housing 10. The fourth heat connection member 27D transfers part of heat generated in the DRAM 25 to the second main wall 12 of the housing 10.

3. Heat-Dissipation Structure

Next, the heat-dissipation structure 40 will be described.

Figure 4:
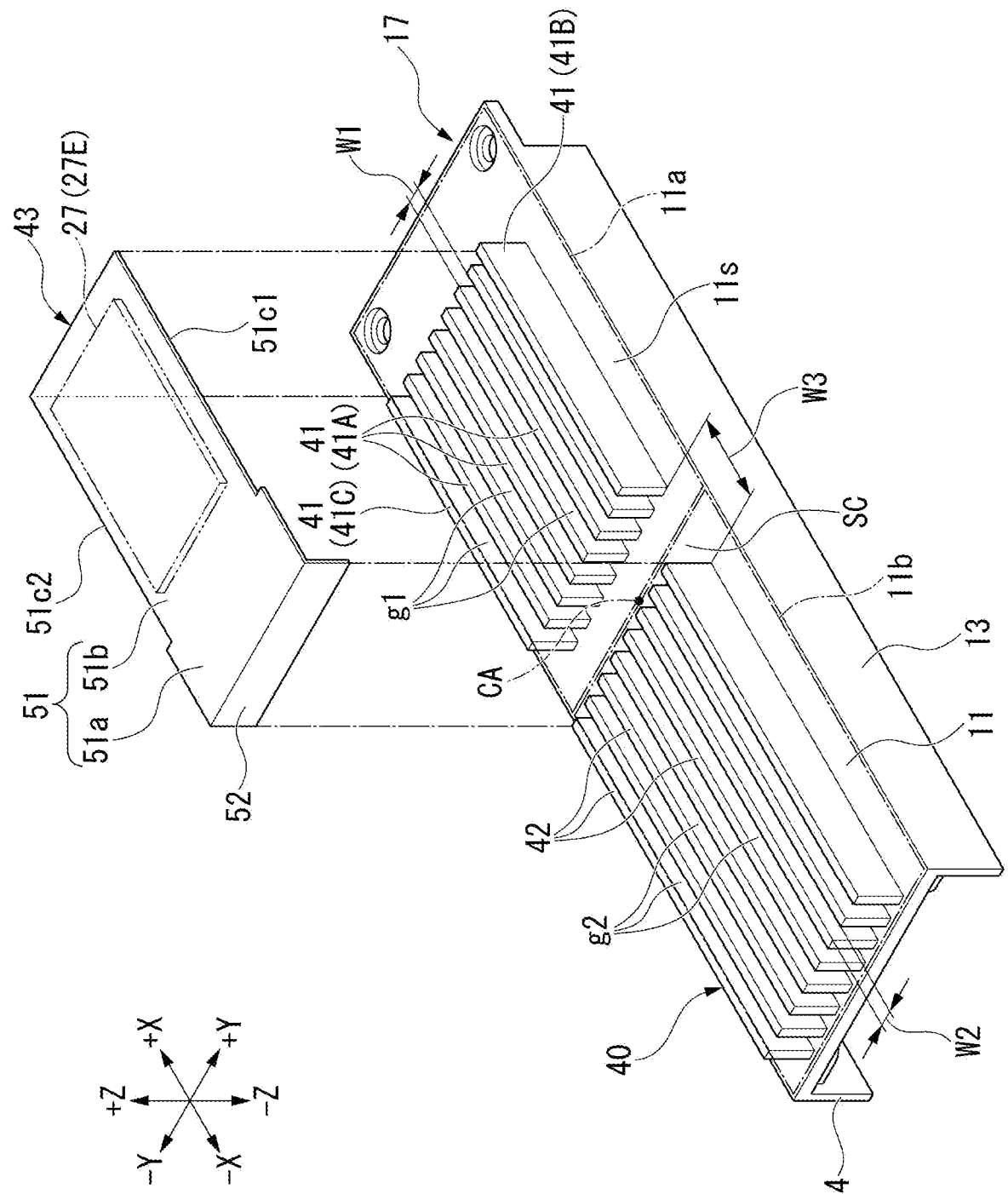
FIG. 4 is a partially exploded perspective view showing a configuration associated with a heat-dissipation structure according to the first embodiment.

FIG. 4 is a partially exploded perspective view showing a configuration associated with the heat-dissipation structure 40.

The heat-dissipation structure 40 is provided on the outer surface 11s of the first main wall 11. The heat-dissipation structure 40 is exposed to the outside of the housing 10. The heat-dissipation structure 40 includes a plurality of first heat-dissipation fins 41, a plurality of second heat-dissipation fins 42, and a flow regulation plate 43.

<3.1 First Heat-Dissipation Fin>

Each of the plurality of the first heat-dissipation fins 41 is a plate portion provided upright from the outer surface 11s of the first main wall 11 in the +Z direction. The plurality of the first heat-dissipation fins 41 may be referred to as a "first heat-dissipation fin array". Each first heat-dissipation fin 41 extends in the X direction. Each first heat-dissipation fin 41 is a plate portion extending in the X direction and the Z direction. The plurality of the first heat-dissipation fins 41 are arranged so as to align in the Y direction. Two first heat-dissipation fins 41 adjacent to each other are spaced by a gap g1 therebetween. The width of the gap g1 is represented as W1 in the Y direction. In the following explanation, a plurality of gaps g1, each of which is between two of the first heat-dissipation fins 41, may be referred to as "gaps g1 between the first heat-dissipation fins 41", "gaps g1 between all of the first heat-dissipation fins 41", or "gaps g1 between some of the first heat-dissipation fins 41". The plurality of the first heat-dissipation fins 41 are parallel to each other. The plurality of the first heat-dissipation fins 41 are provided on the first region 11a of the first main wall 11. The plurality of the first heat-dissipation fins 41 are integrally provided on the housing 10. The plurality of the first heat-dissipation fins 41 are made of metal. Heat from the first semiconductor memory components 24A is transferred to the plurality of the first heat-dissipation fins 41 via, for example, the second heat connection member 27B.

The plurality of the first heat-dissipation fins 41 include a first heat-dissipation fin 41B, a first heat-dissipation fin 41C, and first center region heat-dissipation fins 41A. The first heat-dissipation fin 41B is located at the end in the +Y direction. The first heat-dissipation fin 41C is located at the end in the −Y direction. The first center region heat-dissipation fins 41A are located between the first heat-dissipation fin 41B and the first heat-dissipation fin 41C. The first heat-dissipation fin 41B may be referred to as a "+Y direction first heat-dissipation fin". The first heat-dissipation fin 41C may be referred to as a "−Y direction first heat-dissipation fin". The first center region heat-dissipation fins 41A may be referred to as "the other first heat-dissipation fins". The heights of the first heat-dissipation fin 41B and the first heat-dissipation fin 41C with respect to the outer surface 11s of the first main wall 11 are larger than the heights of the first center region heat-dissipation fins 41A by the thickness of a top plate 51 of the flow regulation plate 43 described below. Consequently, when the top plate 51 of the flow regulation plate 43 overlaps the first center region heat-dissipation fins 41A in the Z direction, the total heights including the height (i.e., the thickness) of the top plate 51 and the height of the first center region heat-dissipation fin 41A in the +Z direction, the height of the first heat-dissipation fin 41B in the +Z direction, and the height of the first heat-dissipation fin 41C in the +Z direction are the same as each other. For example, the edge surface of the top plate 51 in the +Z direction, the edge surface of the first heat-dissipation fin 41B in the +Z direction, and the edge surface of the first heat-dissipation fin 41C in the +Z direction form one plane.

<3.2 Second Heat-Dissipation Fin>

Each of the plurality of the second heat-dissipation fins 42 is a plate portion provided upright from the outer surface 1s of the first main wall 11 in the +Z direction. The plurality of the second heat-dissipation fins 42 may be referred to as a "second heat-dissipation fin array". Each second heat-dissipation fin 42 extends in the X direction. Each second heat-dissipation fin 42 is a plate portion extending in the X direction and the Z direction. The plurality of the second heat-dissipation fins 42 are arranged so as to align in the Y direction. Two second heat-dissipation fins 42 adjacent to each other are spaced by a gap g2 therebetween. The width of the gap g2 is represented as W2 in the Y direction. In the following explanation, a plurality of gaps g2, each of which is between two of the second heat-dissipation fins 42, may be referred to as "gaps g2 between the second heat-dissipation fins 42", "gaps g2 between all of the second heat-dissipation fins 42", or "gaps g2 between some of the second heat-dissipation fins 42". The plurality of the second heat-dissipation fins 42 are parallel to each other. The plurality of the second heat-dissipation fins 42 are provided on the second region 11b of the first main wall 11. The plurality of the second heat-dissipation fins 42 are integrally provided on the housing 10. The plurality of the second heat-dissipation fins 42 are made of metal. Heat from the controller 23 is transferred to the plurality of the second heat-dissipation fins 42 via, for example, the first heat connection member 27A.

In the embodiment, the plurality of the second heat-dissipation fins 42 are apart from the plurality of the first heat-dissipation fins 41 in the X direction. Because of this, a separation flow path SC is formed between the plurality of the second heat-dissipation fins 42 and the plurality of the first heat-dissipation fins 41. The separation flow path SC is a space between the plurality of the second heat-dissipation fins 42 and the plurality of the first heat-dissipation fins 41. The space extends in the Y direction. The width W3 of the separation flow path SC in the X direction is larger than the width W1 of the gap g1 between two of the plurality of the first heat-dissipation fins 41 in the Y direction. Furthermore, the width W3 is larger than the width W2 of the gap g2 between two of the plurality of the second heat-dissipation fins 42 in the Y direction.

<3.3 Flow Regulation Plate>

The flow regulation plate 43 is, for example, a body different from the housing 10. The flow regulation plate 43 is attached to the plurality of the first heat-dissipation fins 41 or the plurality of the second heat-dissipation fins 42. The flow regulation plate 43 is a plate member. The flow regulation plate 43 is an example of a "flow regulator". The flow regulation plate 43 is made of, for example, metal or synthetic resin material. The flow regulation plate 43 is a member configured to change flow directions of air flowing between the first heat-dissipation fins 41, or flow directions of air flowing between the second heat-dissipation fins 42.

Here, the airflow that flows between the first heat-dissipation fins 41 may be referred to as "first airflow", and the airflow that flows between the second heat-dissipation fins 42 may be referred to as "second airflow". In the embodiment, the flow regulation plate 43 includes the top plate 51 and a flow-blocking portion 52.

<Top Plate>

The top plate 51 is a plate portion extending in the X direction and the Y direction. The top plate 51 is disposed at the side in the +Z direction with respect to the plurality of the first heat-dissipation fins 41. The top plate 51 is a member configured to prevent the air flowing in the gaps g1 between the first heat-dissipation fins 41 from being mixed with the air flowing to the plurality of the second heat-dissipation fins 42. In the embodiment, the top plate 51 includes a first top plate 51a and a second top plate 51b.

The first top plate 51a is disposed at the side in the +Z direction with respect to the separation flow path SC. The first top plate 51a covers at least a part of the separation flow path SC from the opposite side of the first main wall 11. In the embodiment, the first top plate 51a covers the entire separation flow path SC from the opposite side of the first main wall 11. The first top plate 51a is an example of a "second cover portion".

As shown in FIG. 1, an opening portion 61 is defined between the end portion on the side in the +Y direction of the first top plate 51a and the first main wall 11. The opening portion 61 opens in the +Y direction. The opening portion 61 causes the separation flow path SC to be in communication with the outside. The opening portion 61 is formed in a rectangular shape having four sides defined by, for example, the first top plate 51a, the first main wall 11, the first heat-dissipation fin 41B, and the flow-blocking portion 52 described below. The length W11 of the opening portion 61 in the X direction is longer than the length W12 of the opening portion 61 in the Z direction. The opening portion 61 is an example of a "first opening portion". Note that the length W1 of the opening portion 61 in the X direction may be shorter than the length W12 of the opening portion 61 in the Z direction.

Similarly to the above, an opening portion 62 is defined between the end portion on the side in the −Y direction of the first top plate 51a and the first main wall 11. The opening portion 62 opens in the −Y direction. The opening portion 62 causes the separation flow path SC to be in communication with the outside. The opening portion 62 is formed in a rectangular shape having four sides defined by, for example, the first top plate 51a, the first main wall 11, the first heat-dissipation fin 41C, and the flow-blocking portion 52 described below. The length W11 of the opening portion 62 in the X direction is longer than the length W12 of the opening portion 62 in the Z direction. Note that the length W11 of the opening portion 62 in the X direction may be shorter than the length W12 of the opening portion 62 in the Z direction.

As shown in FIG. 4, the second top plate 51b extends in the +X direction from the end portion on the side in the +X direction of the first top plate 51a. The second top plate 51b is disposed at the side in the +Z direction with respect to the plurality of the first heat-dissipation fins 41. The second top plate 51b is an example of a "third cover portion".

The second top plate 51b covers at least a part of the gaps g1 between the first heat-dissipation fins 41 from the opposite side of the first main wall 11. In the present application, "covers at least a part of the gap between the first heat-dissipation fins" is not limited to covering at least a part of each of the gaps between all of the first heat-dissipation fins, but may also include a case of covering at least a part (for example, a part in the X direction) of each of the gaps between some heat-dissipation fins included in the above-mentioned first heat-dissipation fins. In the embodiment, the second top plate 51b is provided so as to extend through the entire length of the first heat-dissipation fin 41 in the X direction. In the embodiment, the second top plate 51b covers the gaps g1 between all of the first heat-dissipation fins 41 from the opposite side of the first main wall 11.

In the embodiment, a cutout 51c1 is provided at the end portion on the side in the +Y direction of the top plate 51. The cutout 51c1 is formed so as to avoid the first heat-dissipation fin 41B such that the second top plate 51b does not interfere with the first heat-dissipation fin 41B. A cutout 51c2 is provided at the end portion on the side in the −Y direction of the top plate 51. The cutout 51c2 is formed so as to avoid the first heat-dissipation fin 41C such that the second top plate 51b does not interfere with the first heat-dissipation fin 41C. The top plate 51 is fitted between the first heat-dissipation fin 41B and the first heat-dissipation fin 41C. The top plate 51 is in contact with the end portions of the plurality of the first heat-dissipation fins 41 (more specifically, in contact with the end portions of the first center region heat-dissipation fins 41A) in the +Z direction.

The top plate 51 is fixed to the first heat-dissipation fins 41B and 41C which are both ends of the first heat-dissipation fin array by, for example, pressure bonding, caulking processing, shrink fitting, or the like. However, a method of fixing the top plate 51 is not limited to the above-described examples. The top plate 51 may be fixed to the first heat-dissipation fins by a method of using a screw or other methods.

<Flow-Blocking Portion>

The flow-blocking portion 52 is a plate portion extending in the Y direction and the Z direction. The flow-blocking portion 52 extends in the −Z direction from the end portion on the side in the −X direction of the first top plate 51a. As a method of forming the flow-blocking portion 52, for example, firstly, one plate including the top plate 51 and the flow-blocking portion 52 is prepared, the flow-blocking portion 52 is bent with respect to the top plate 51, and thereby the flow-blocking portion 52 is formed.

The flow-blocking portion 52 is disposed at the side in the −X direction with respect to the plurality of the first heat-dissipation fins 41. The flow-blocking portion 52 is a member configured to prevent the airflow passing through the gaps g1 between the first heat-dissipation fins 41 from flowing into the gaps g2 between the second heat-dissipation fins 42. The flow-blocking portion 52 is an example of a "first cover portion".

Figure 5:
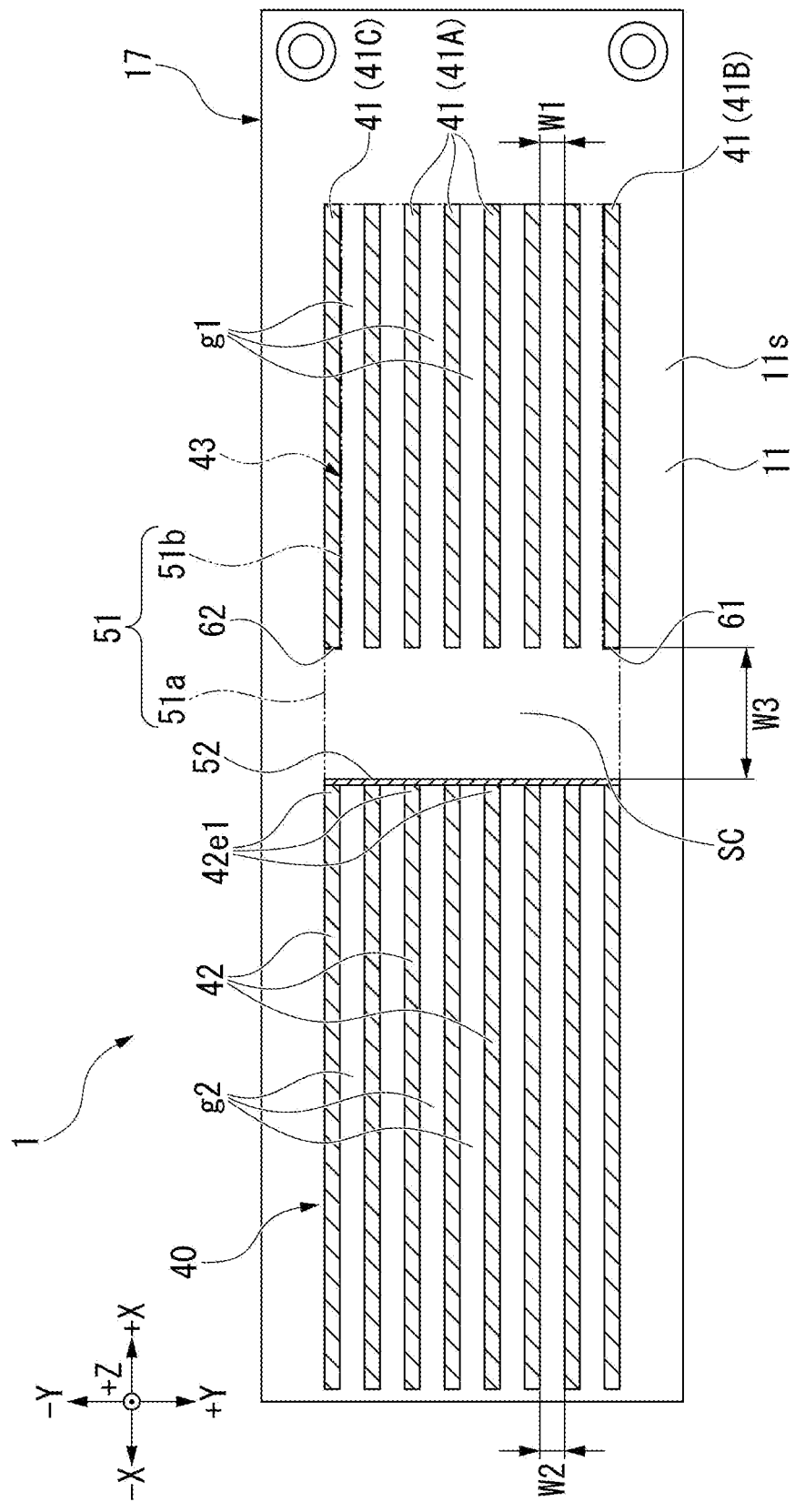
FIG. 5 is a cross-sectional view taken along line F5-F5 of the semiconductor storage device shown in FIG. 3.

FIG. 5 is a cross-sectional view taken along line F5-F5 of the semiconductor storage device 1 shown in FIG. 3. The flow-blocking portion 52 is disposed between the plurality of the first heat-dissipation fins 41 and the plurality of the second heat-dissipation fins 42 in the X direction. The flow-blocking portion 52 covers at least a part of the gaps g2 between the second heat-dissipation fins 42 when viewed from the X direction. In the present application, "covers at least a part of the gap between the second heat-dissipation fins" is not limited to covering at least a part of each of the gaps between all of the second heat-dissipation fins, but may also include a case of covering at least a part (for example, a part of in the Z direction or a part of in the Y direction) of each of the gaps between some heat-dissipation fins included in the above-mentioned second heat-dissipation fins. In the embodiment, the flow-blocking portion 52 covers the gaps g2 between all of the second heat-dissipation fins 42 when viewed from the X direction.

In the embodiment, the flow-blocking portion 52 is disposed at the end portion on the side in the −X direction of the separation flow path SC. The flow-blocking portion 52 is adjacent to end portions 42e1 on the side in the +X direction of the plurality of the second heat-dissipation fins 42. The end portions 42e1 on the side in the +X direction of the second heat-dissipation fins 42 are end portions facing the first heat-dissipation fins 41.

4. Action

Figure 6:
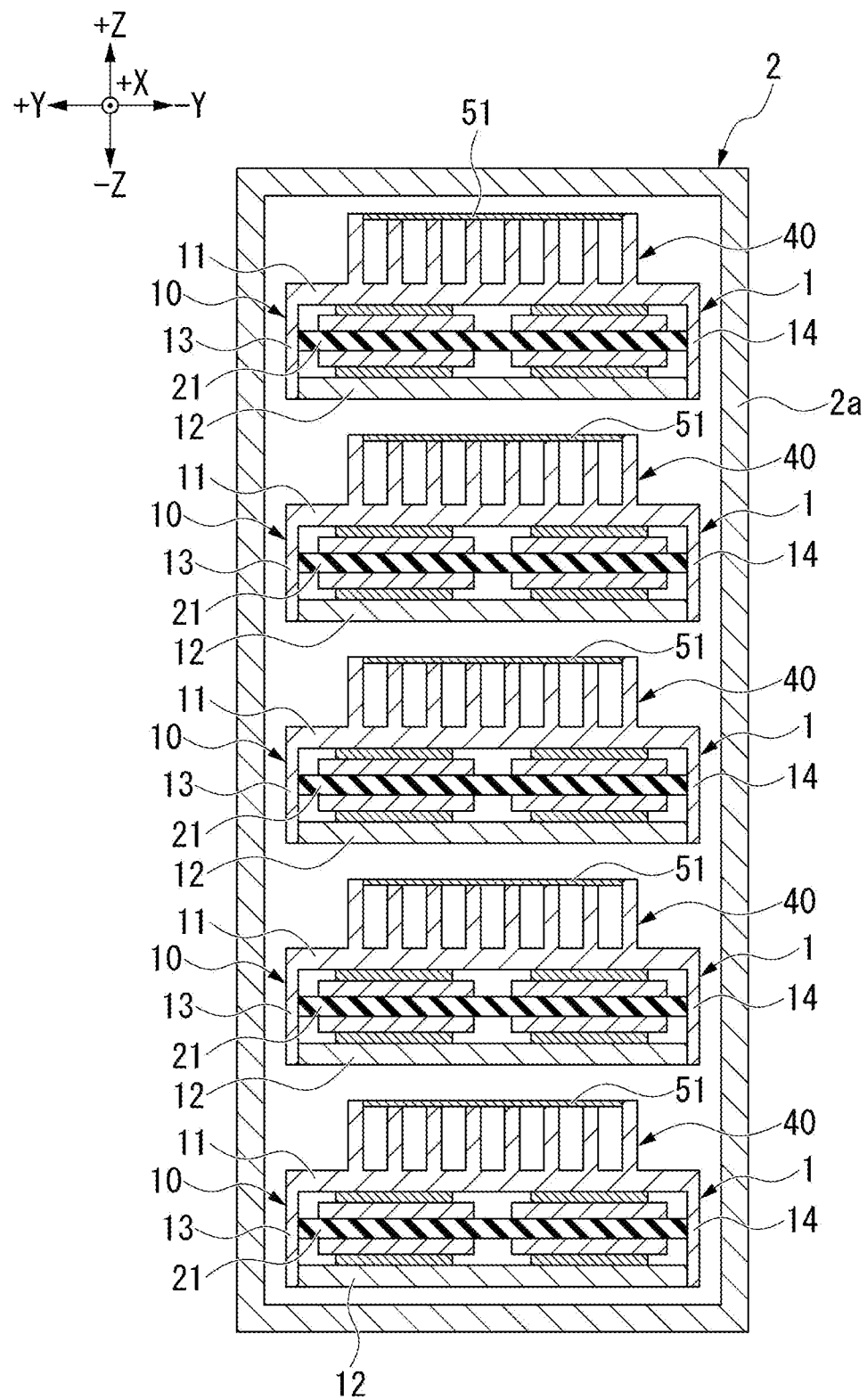
FIG. 6 is a cross-sectional view showing an example of an environment in which the semiconductor storage device according to the first embodiment is used.

FIG. 6 is a cross-sectional view showing an example of an environment in which the semiconductor storage device 1 is used. A host device 2 includes a housing 2a. A plurality of the semiconductor storage devices 1 are arranged so as to align in the housing 2a in the Z direction. Gaps between the semiconductor storage devices 1 overlapping in the Z direction are relatively narrow. Similarly to the above, a gap between each semiconductor storage device 1 and the inner surface of the housing 2a is relatively narrow. Consequently, if there is a place at which a flow path is expanded, air flowing around the semiconductor storage devices 1 easily flows along the expanded flow path.

Figure 7:
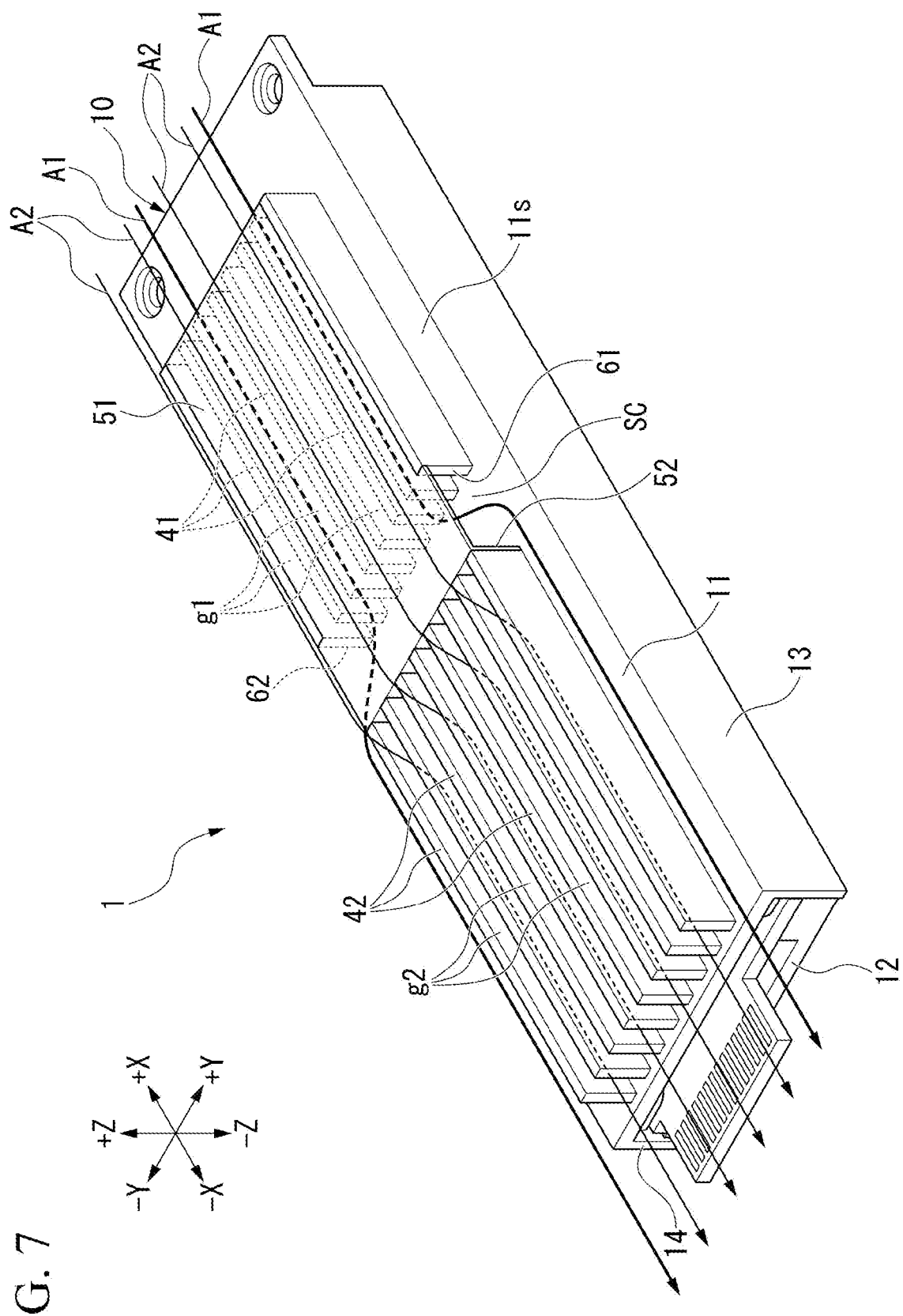
FIG. 7 is an explanatory view showing an action of the semiconductor storage device according to the first embodiment.

FIG. 7 is an explanatory view showing an action of the semiconductor storage device 1. Air flowing in the −X direction is supplied to the periphery of the semiconductor storage device 1 by an air blower (not shown in the drawings) of the host device 2.

In FIG. 7, the arrow A1 shown by a thick line represents part of airflow supplied to the periphery of the semiconductor storage device 1 (hereinbelow, referred to as "airflow A1"). The airflow A1 flows into the gaps g1 between the first heat-dissipation fins 41 and flows through the gaps g1 in the −X direction. The airflow A1 flows between the first main wall 11 of the housing 10 and the top plate 51 of the flow regulation plate 43. Consequently, the plurality of the first heat-dissipation fins 41 are cooled down, heat dissipation from the first semiconductor memory components 24A is prompted by the fins.

After the airflow A1 passes through the gaps g1 between the first heat-dissipation fins 41, the airflow A1 is blocked by the flow-blocking portion 52 of the flow regulation plate 43 at the end portion on the side in the −X direction of the separation flow path SC. The flow direction of the airflow A1 is changed by being blocked by the flow-blocking portion 52 of the flow regulation plate 43.

For example, the flow direction of part of the airflow A1 is changed into the +Y direction by being blocked by the flow-blocking portion 52. The part of the airflow A1 in the changed flow direction flows in the separation flow path SC in the +Y direction, and flows from the opening portion 61 to the outside of the heat-dissipation structure 40. The airflow A1 flowing out from the opening portion 61 is mixed with air flowing in the outside of the semiconductor storage device 1 and flows in the −X direction.

On the other hand, the flow direction of the other part of the airflow A1 is changed into the −Y direction by being blocked by the flow-blocking portion 52. The other part of the airflow A1 in the changed flow direction flows in the separation flow path SC in the −Y direction, and flows from the opening portion 62 to the outside of the heat-dissipation structure 40. The airflow A1 flowing out from the opening portion 62 is mixed with air flowing in the outside of the semiconductor storage device 1 and flows in the −X direction.

In FIG. 7, the arrow A2 shown by a fine line represents the other part of the airflow supplied to the periphery of the semiconductor storage device 1 (hereinbelow, referred to as "airflow A2"). The airflow A2 does not flow into the gaps g1 between the first heat-dissipation fins 41 but flows on the side in the +Z direction with respect to the top plate 51 of the flow regulation plate 43. This means that, in the plurality of the semiconductor storage devices 1 arranged side by side in the Z direction (refer to FIG. 6), of two semiconductor storage devices 1 adjacent to each other in the Z direction, the airflow A2 flows into the gap between the top plate 51 of the flow regulation plate 43 of one of the two semiconductor storage devices 1 and the second main wall 12 of the other of the two semiconductor storage devices 1 located at the side in the +Z direction.

After the airflow A2 passes through the end portion on the side in the −X direction of the top plate 51 of the flow regulation plate 43, the airflow A2 flows into the gaps g2 between the second heat-dissipation fins 42. The airflow A2 that has flowed into the gaps g2 between the second heat-dissipation fins 42 flows in the gaps g2 in the −X direction. Consequently, the plurality of the second heat-dissipation fins 42 are cooled down, and heat dissipation from the controller 23 is prompted by the fins. After the airflow A2 passes through the gaps g2 between the second heat-dissipation fins 42, the airflow A2 flows in the −X direction while being unchanged in direction.

5. Advantage

As a comparative example, a case in which the plurality of the first heat-dissipation fins 41 and the plurality of the second heat-dissipation fins 42 are continuously formed is in consideration. In the configuration of the comparative example, air heated by heat of the first semiconductor memory components 24A by passing through the gaps g1 between the first heat-dissipation fins 41 flows into the gaps g2 between the second heat-dissipation fins 42. Accordingly, there is a concern that heat dissipation from the controller 23 is less easily prompted.

In the embodiment, the heat-dissipation structure 40 of the semiconductor storage device 1 includes the plurality of the first heat-dissipation fins 41, the plurality of the second heat-dissipation fins 42, and the flow-blocking portion 52. The plurality of the second heat-dissipation fins 42 are apart from the plurality of the first heat-dissipation fins 41 in the X direction. The flow-blocking portion 52 is disposed between the plurality of the first heat-dissipation fins 41 and the plurality of the second heat-dissipation fins 42. The flow-blocking portion 52 covers at least a part of the gaps g2 between the second heat-dissipation fins 42 when viewed from the X direction.

With this configuration, by the flow-blocking portion 52, at least part of the airflow passing through the gaps g1 between the first heat-dissipation fins 41 is prevented from flowing into the gaps g2 between the second heat-dissipation fins 42. As a result, another airflow having a temperature lower than that of the airflow passing through the gaps g1 flows into the gaps g2 between the second heat-dissipation fins 42. Therefore, as compared with the configuration of the comparative example, cooling of the plurality of the second heat-dissipation fins 42 is easily prompted, and therefore heat dissipation from the controller 23 is easily prompted.

Accordingly, it is possible to improve heat dissipation of the semiconductor storage device 1.

In the embodiment, the heat-dissipation structure 40 includes the first top plate 51a. The first top plate 51a covers at least a part of the space (e.g., separation flow path SC) between the plurality of the first heat-dissipation fins 41 and the plurality of the second heat-dissipation fins 42 from the opposite side of the housing 10. With this configuration, it is possible to further prevent the airflow passing through the gaps g1 between the first heat-dissipation fins 41 from flowing into the gaps g2 between the second heat-dissipation fins 42.

In the embodiment, the opening portions 61 and 62 are provided between the first top plate 51a and the housing 10. Each of the opening portions 61 and 62 opens in the Y direction. Each of the opening portions 61 and 62 causes the separation flow path SC to be in communication with the outside. With this configuration, it is possible to cause the airflow that has passed through the gaps g1 between the first heat-dissipation fins 41 and flowed into the separation flow path SC to flow out through the opening portions 61 and 62 to the outside of the heat-dissipation structure 40. Consequently, it is possible to further prevent the airflow passing through the gaps g1 between the first heat-dissipation fins 41 from flowing into the gaps g2 between the second heat-dissipation fins 42.

In the embodiment, the heat-dissipation structure 40 includes the second top plate 51b. The second top plate 51b covers at least a part of the gaps g1 between the first heat-dissipation fins 41 from the opposite side of the housing 10. With this configuration, the air flowing in the gaps g1 between the first heat-dissipation fins 41 can be prevented from flowing out from the gaps g1 in the +Z direction and thereby be prevented from being mixed with other air flowing toward the plurality of the second heat-dissipation fins 42. Accordingly, it is possible to further prevent the air flowing through the gaps g1 between the first heat-dissipation fins 41 from flowing into the gaps g2 between the second heat-dissipation fins 42.

In the embodiment, the flow-blocking portion 52 is adjacent to the end portions 42e1 of the second heat-dissipation fins 42 on the side in the +X direction. With this configuration, it is easy to ensure large sizes of the opening portions 61 and 62. For this reason, it is possible to cause the air flowing the separation flow path SC to smoothly flow out to the outside.

Note that, as shown in FIG. 4, a fifth heat connection member 27E serving as one of the heat connection members 27 may be provided between the top plate 51 and the end portions of the plurality of the first heat-dissipation fins 41 in the +Z direction. In the case of the fifth heat connection member 27E being provided, part of heat from the first semiconductor memory components 24A transferred to the plurality of the first heat-dissipation fins 41 is easily transferred to the top plate 51. Therefore, it is possible to further improve heat dissipation.

6. Modified Examples

Next, some modified examples according to the first embodiment will be described. Configurations of each modified example other than those described below are the same as the configurations according to the first embodiment.

First Modified Example

Figure 8:
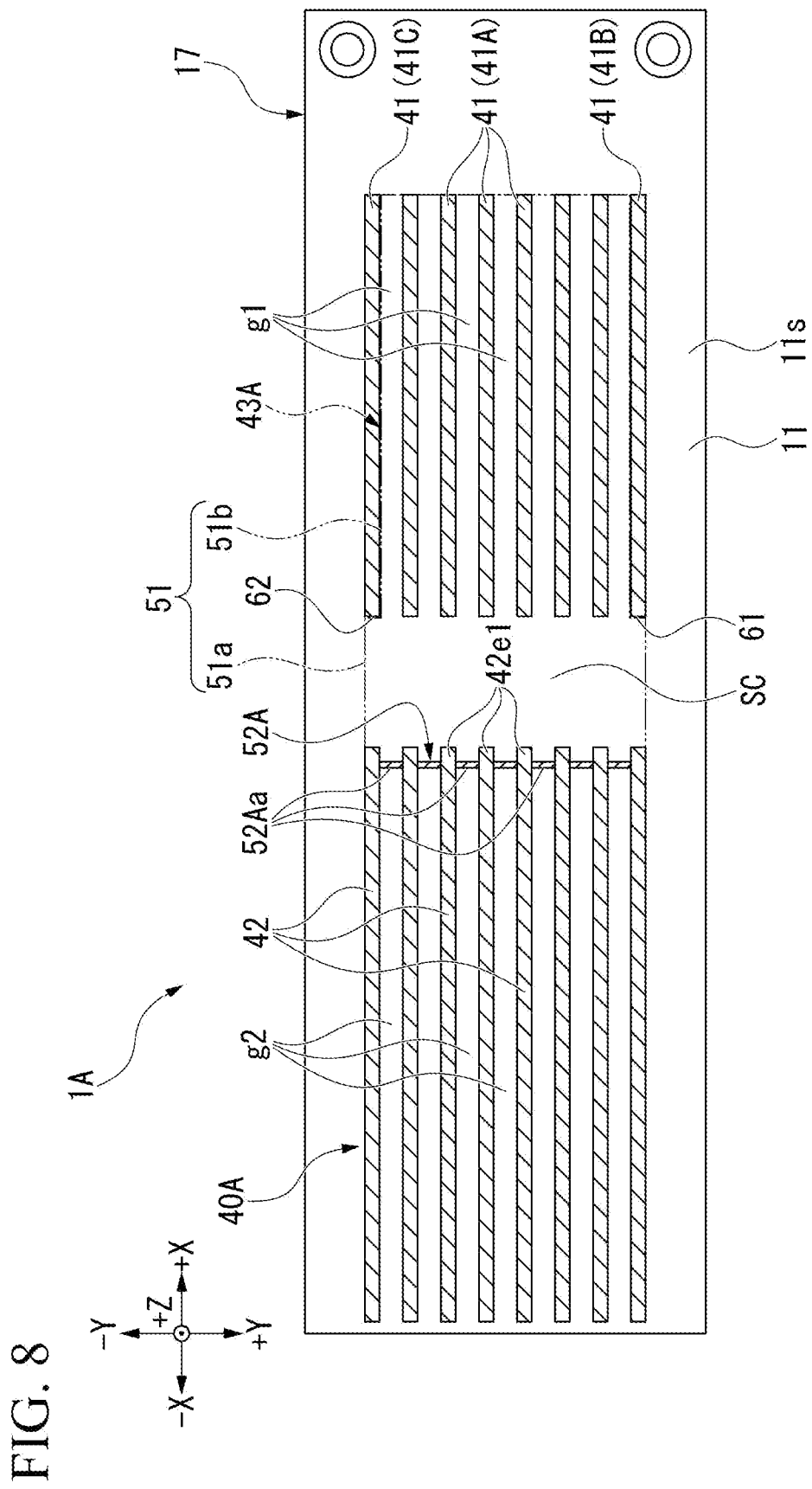
FIG. 8 is a plan view showing a semiconductor storage device according to a first modified example of the first embodiment.

FIG. 8 is a plan view showing a semiconductor storage device 1A according to a first modified example. A heat-dissipation structure 40A of the semiconductor storage device 1A according to the first modified example includes a flow regulation plate 43A instead of the flow regulation plate 43. The flow regulation plate 43A includes one or more flow-blocking portions 52A.

In the modified example, the flow-blocking portion 52A is disposed at each of the gaps g2 between the second heat-dissipation fins 42. For example, the flow-blocking portion 52A includes a plurality of insertion portions 52Aa. The insertion portion 52Aa is inserted to each of the gaps g2 between the second heat-dissipation fins 42. The insertion portions 52Aa are arranged in the Y direction. The insertion portions 52Aa are aligned on the end portions 42e1 of the second heat-dissipation fins 42 on the side in the +X direction. The insertion portions 52Aa are disposed at the gaps g2 between the second heat-dissipation fins 42 in one-to-one correspondence. The flow-blocking portion 52A covers at least a part of the gaps g2 between the second heat-dissipation fins 42 when viewed from the X direction. In the embodiment, the flow-blocking portion 52A covers the gaps g2 between all of the second heat-dissipation fins 42 when viewed from the X direction.

Also with this configuration, the airflow passing through the gaps g1 between the first heat-dissipation fins 41 is prevented from flowing into the gaps g2 between the second heat-dissipation fins 42. Consequently, heat dissipation from the controller 23 is easily prompted, and therefore it is possible to improve heat dissipation of the semiconductor storage device 1A.

Second Modified Example

Figure 9:
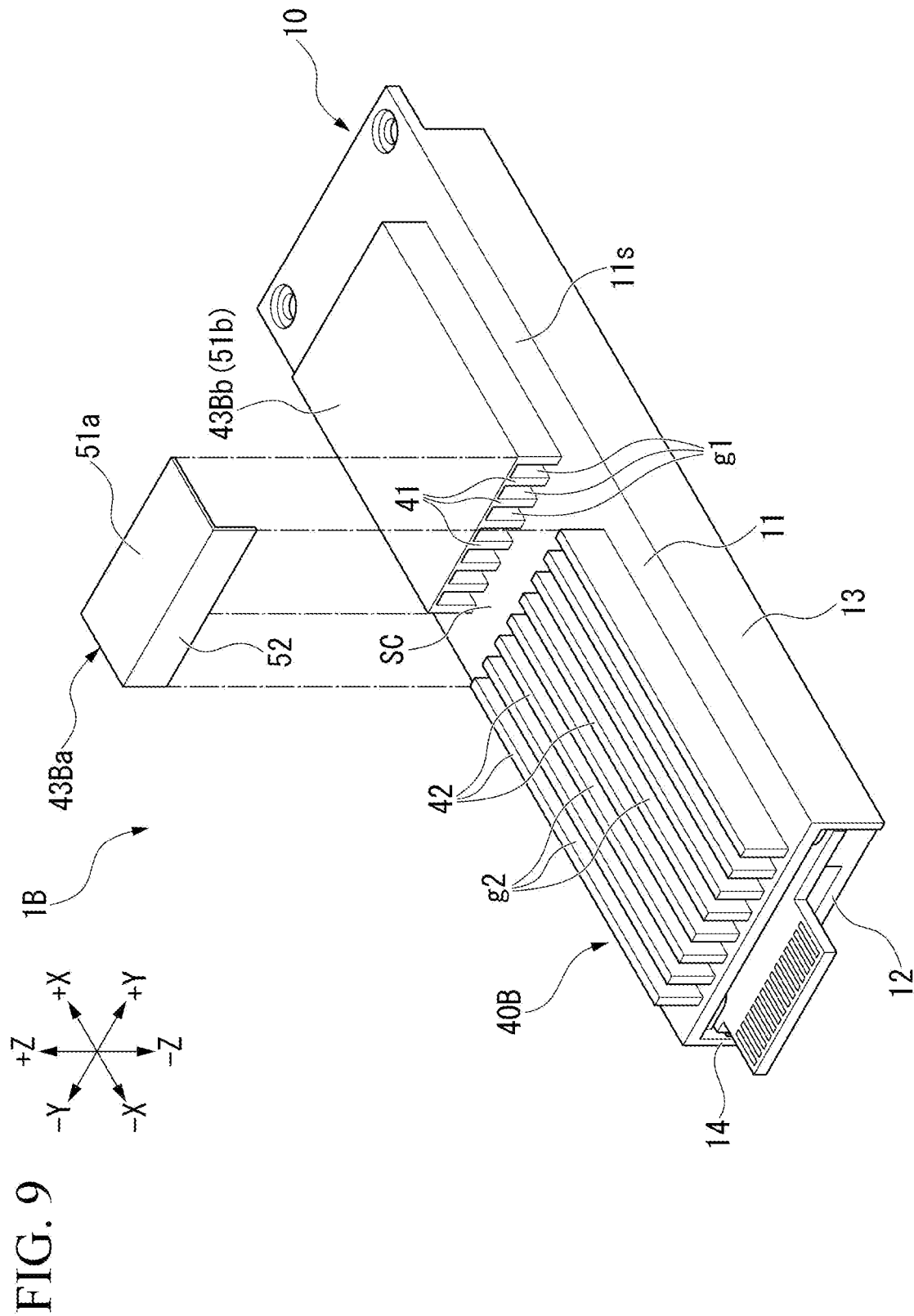
FIG. 9 is a perspective view showing a semiconductor storage device according to a second modified example of the first embodiment.

FIG. 9 is a perspective view showing a semiconductor storage device 1B according to a second modified example. A heat-dissipation structure 40B of the semiconductor storage device 1B according to the second modified example includes a flow regulation plate 43Ba and a second top plate 43Bb instead of the flow regulation plate 43.

The flow regulation plate 43Ba includes the first top plate 51a and the flow-blocking portion 52. The first top plate 51a and the flow-blocking portion 52 are the same as the first top plate 51a and the flow-blocking portion 52 according to the aforementioned first embodiment, respectively. In the modified example, the first top plate 51a and the second top plate 51b are different members from each other as the first top plate 51a and the second top plate 43Bb.

The second top plate 43Bb is a member corresponding to the second top plate 51b according to the first embodiment. In the modified example, the second top plate 43Bb and the plurality of the first heat-dissipation fins 41 are integrally linked to each other and thereby form one body.

With this configuration, since the second top plate 43Bb and the plurality of the first heat-dissipation fins 41 form one body, part of heat transferred from the first semiconductor memory components 24A to the plurality of the first heat-dissipation fins 41 is easily transferred from the plurality of the first heat-dissipation fins 41 to the second top plate 43Bb. Consequently, heat dissipation of the first semiconductor memory components 24A may be further prompted.

Third Modified Example

Figure 10:
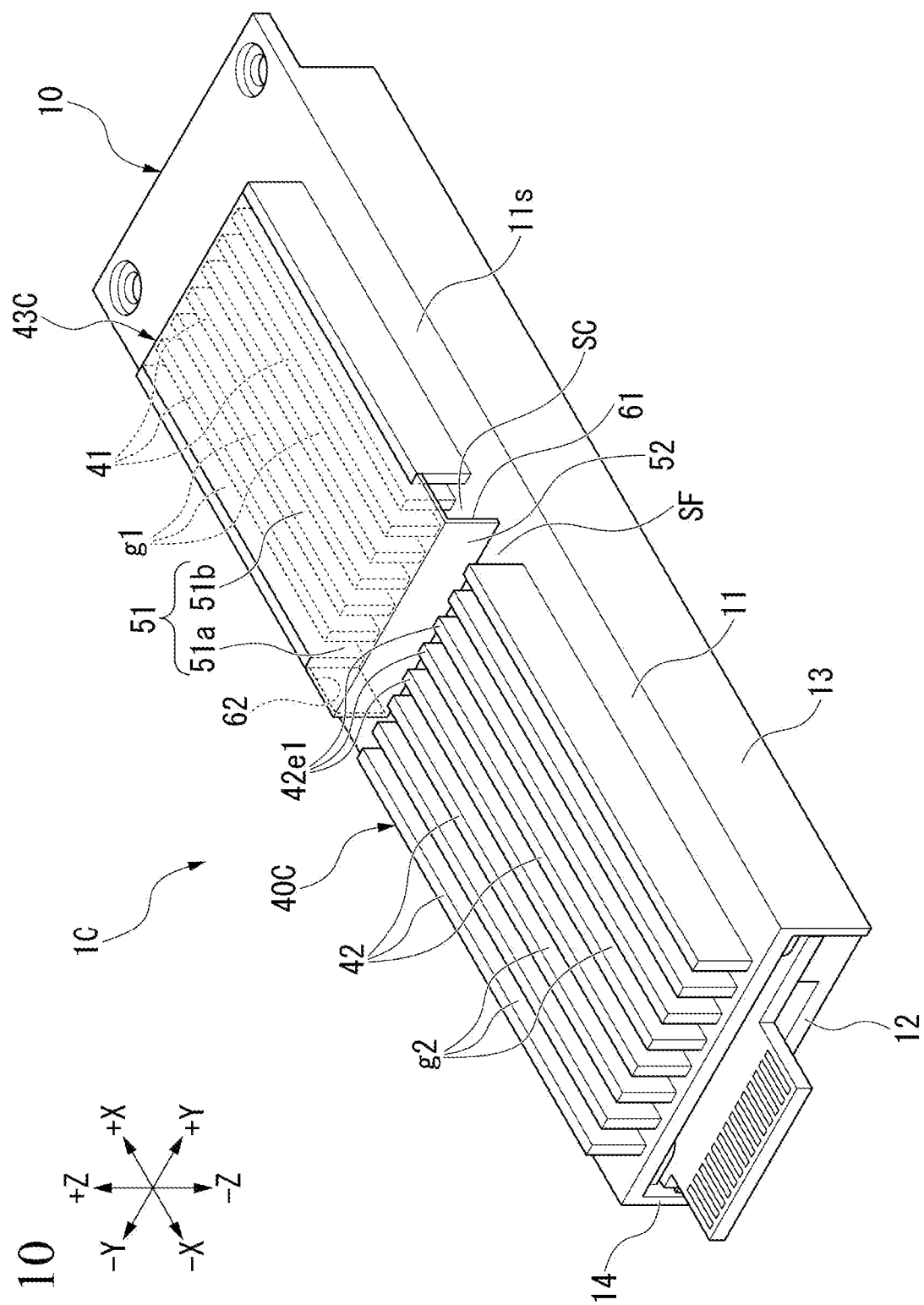
FIG. 10 is a perspective view showing a semiconductor storage device according to a third modified example of the first embodiment.

FIG. 10 is a perspective view showing a semiconductor storage device 1C according to a third modified example. A heat-dissipation structure 40C of the semiconductor storage device 1C according to the third modified example includes a flow regulation plate 43C instead of the flow regulation plate 43. The flow regulation plate 43C includes the top plate 51 and the flow-blocking portion 52.

The flow-blocking portion 52 is apart from the end portions 42e1 on the side in the +X direction of the plurality of the second heat-dissipation fins 42 in the X direction. In the modified example, a space SF is present between the flow-blocking portion 52 and the end portions 42e1 on the side in the +X direction of the plurality of the second heat-dissipation fins 42. The space SF opens in the +Z direction, the +Y direction, and the −Y direction.

The space SF is present between the end portions 42e1 on the side in the +X direction of the plurality of the second heat-dissipation fins 42 and the flow-blocking portion 52. Therefore, the gaps g2 between the second heat-dissipation fins 42 open at the end portions 42e1 on the side in the +X direction of the plurality of the second heat-dissipation fins 42 in the +X direction. The gaps g2 between the second heat-dissipation fins 42 are in communication with the space SF in the X direction. The gaps g2 between the second heat-dissipation fins 42 are in communication with the outside via the space SF.

With this configuration, as compared with the case in which the flow-blocking portion 52 is adjacent to the end portions 42e1 on the side in the +X direction of the plurality of the second heat-dissipation fins 42, the air flowing on the side in the +Z direction with respect to the top plate 51 easily flows into the gaps g2 between the second heat-dissipation fins 42 via the space SF. Consequently, heat dissipation of the controller 23 can be further prompted.

Fourth Modified Example

Figure 11:
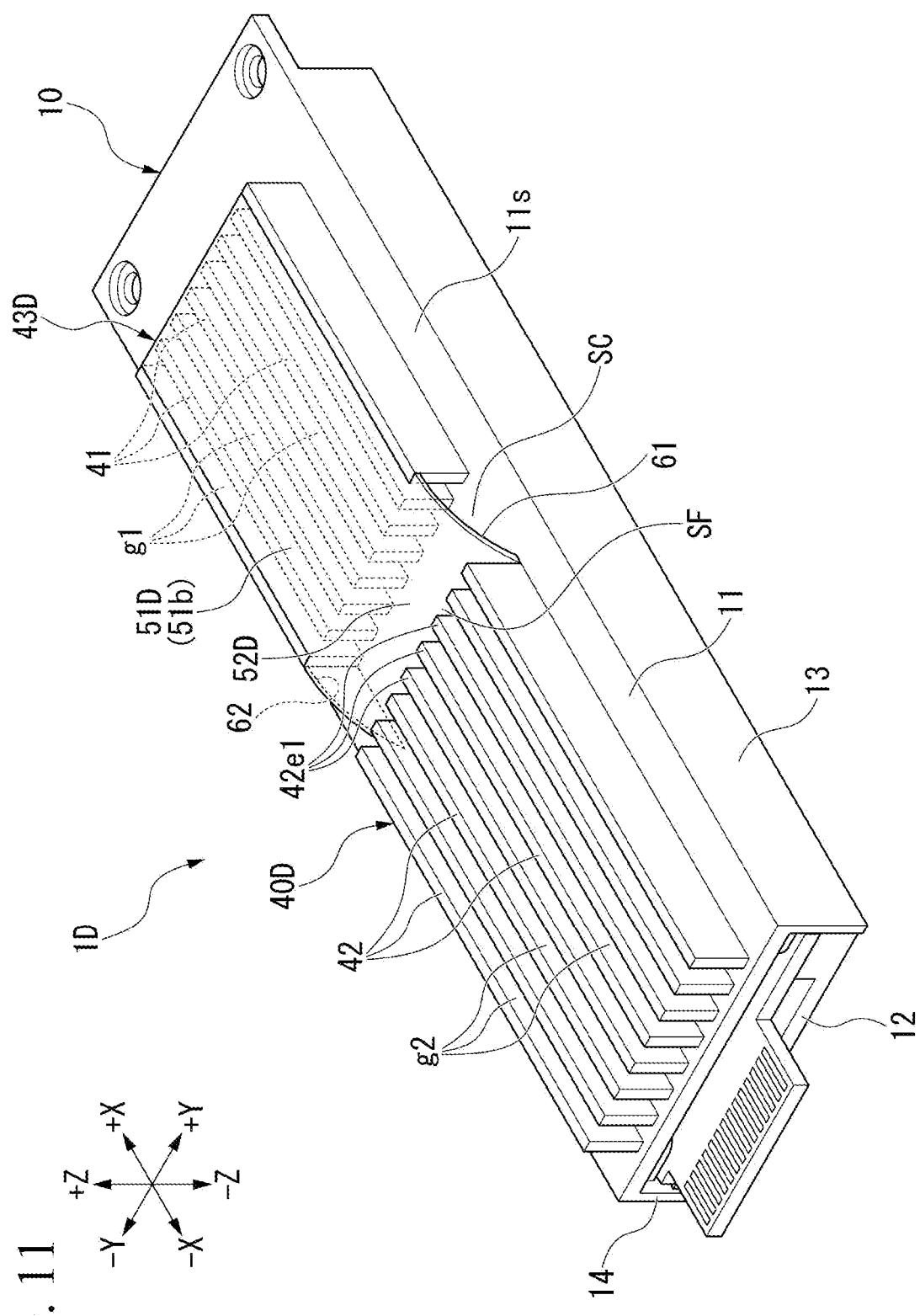
FIG. 11 is a perspective view showing a semiconductor storage device according to a fourth modified example of the first embodiment.

FIG. 11 is a perspective view showing a semiconductor storage device 1D according to a fourth modified example. A heat-dissipation structure 40D of the semiconductor storage device 1D according to the fourth modified example includes a flow regulation plate 43D instead of the flow regulation plate 43. The flow regulation plate 43D includes a top plate 51D and a flow-blocking portion 52D.

The top plate 51D is the same as the second top plate 51b according to the first embodiment. For example, the top plate 51D extends from the end portions on the side in the +X direction of the plurality of the first heat-dissipation fins 41 to the end portions on the side in the −X direction of the plurality of the first heat-dissipation fins 41.

The flow-blocking portion 52D is connected to the end portion on the side in the −X direction of the top plate 51D. The flow-blocking portion 52D is inclined with respect to the X direction such that, as the flow-blocking portion 52D gradually approaches the end portion on the side in the −X direction, the flow-blocking portion 52D gradually approaches the end portion on the side in the −Z direction. In other words, the flow-blocking portion 52D is inclined with respect to the X direction so as to extend from an upper position on the side in the −X and +Z directions of the end portions of the plurality of the first heat-dissipation fins 41 to a lower position on the side in the +X and −Z directions of the end portions of the plurality of the second heat-dissipation fins 42. The flow-blocking portion 52D is formed in, for example, a circular arc shape such that, as the flow-blocking portion 52D gradually approaches the end portion on the side in the −X direction, an amount of inclination of the flow-blocking portion 52D with respect to the X direction increases. In other words, the flow-blocking portion 52D is formed in a circular arc shape having a projected form in the +Z direction side. Here, the amount of inclination means an angle of inclination with respect to the X direction. Note that the flow-blocking portion 52D may be formed in a flat-plate shape having a constant amount of inclination with respect to the X direction. The flow-blocking portion 52D may be formed in a circular arc shape such that, as the flow-blocking portion 52D gradually approaches the end portion on the side in the −X direction, an amount of inclination of the flow-blocking portion 52D with respect to the X direction decreases. In other words, the flow-blocking portion 52D may be formed in a circular arc shape having a projected form in the −Z direction side. The end portion on the side in the −X direction of the flow-blocking portion 52D is in contact with the first main wall 11 between the plurality of the first heat-dissipation fins 41 and the plurality of the second heat-dissipation fins 42. The flow-blocking portion 52D covers the gaps g2 between the second heat-dissipation fins 42 when viewed from the X direction. The opening portions 61 and 62 are defined between the flow-blocking portion 52D and the first main wall 11.

In the modified example, since the flow-blocking portion 52D is inclined with respect to the X direction, the space SF is present between the flow-blocking portion 52D and the end portions 42e1 on the side in the +X direction of the plurality of the second heat-dissipation fins 42. The gaps g2 between the second heat-dissipation fins 42 open in the X direction at the end portions 42e1 on the side in the +X direction of the plurality of the second heat-dissipation fins 42. The gaps g2 between the second heat-dissipation fins 42 are in communication with the space SF in the X direction. The gaps g2 between the second heat-dissipation fins 42 are in communication with the outside via the space SF.

With this configuration, since the flow-blocking portion 52D is inclined with respect to the X direction, the air flowing on the side in the +Z direction with respect to the top plate 51D easily flows into the gaps g2 between the second heat-dissipation fins 42 along the flow-blocking portion 52D. Consequently, heat dissipation of the controller 23 can be further prompted.

Fifth Modified Example

Figure 12:
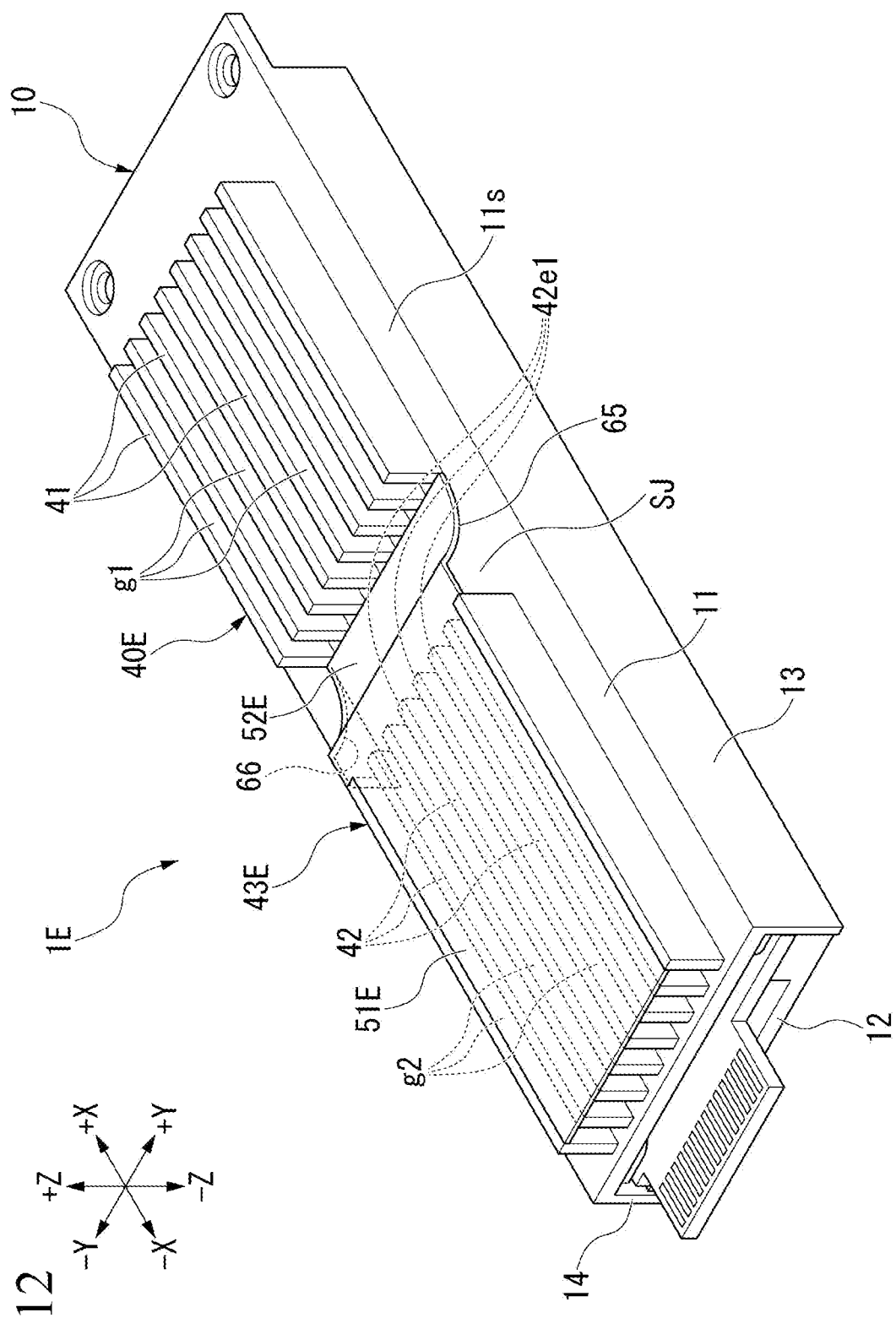
FIG. 12 is a perspective view showing a semiconductor storage device according to a fifth modified example of the first embodiment.

FIG. 12 is a perspective view showing a semiconductor storage device 1E according to a fifth modified example. A heat-dissipation structure 40E of the semiconductor storage device 1E according to the fifth modified example includes a flow regulation plate 43E instead of the flow regulation plate 43. The flow regulation plate 43E includes a flow-blocking portion 52E and a top plate 51E.

In the modified example, a top plate is not present on the side in the +Z direction of the plurality of the first heat-dissipation fins 41. The gaps g1 between the first heat-dissipation fins 41 open in the +Z direction.

The end portion on the side in the +X direction of the flow-blocking portion 52E is in contact with the first main wall 11 between the plurality of the first heat-dissipation fins 41 and the plurality of the second heat-dissipation fins 42. The flow-blocking portion 52E is inclined with respect to the X direction such that, as the flow-blocking portion 52E gradually approaches the end portion on the side in the −X direction, the flow-blocking portion 52E gradually approaches the end portion on the side in the +Z direction. In other words, the flow-blocking portion 52E is inclined with respect to the X direction so as to extend upwardly from a lower position on the side in the −X and −Z directions of the end portions of the plurality of the first heat-dissipation fins 41. The flow-blocking portion 52E is formed in, for example, a circular arc shape such that, as the flow-blocking portion 52E gradually approaches the end portion on the side in the −X direction, an amount of inclination of the flow-blocking portion 52E with respect to the X direction increases. In other words, the flow-blocking portion 52E is formed in a circular arc shape having a projected form in the −Z direction side. Here, the amount of inclination means an angle of inclination with respect to the X direction. Note that the flow-blocking portion 52E may be formed in a flat-plate shape having a constant amount of inclination with respect to the X direction. The flow-blocking portion 52E may be formed in a circular arc shape such that, as the flow-blocking portion 52E gradually approaches the end portion on the side in the −X direction, an amount of inclination of the flow-blocking portion 52E with respect to the X direction decreases. In other words, the flow-blocking portion 52E may be formed in a circular arc shape having a projected form in the +Z direction side.

The top plate 51E is a plate portion extending in the X direction and the Y direction. The top plate 51E is disposed at the side in the +Z direction with respect to the plurality of the second heat-dissipation fins 42. The top plate 51E covers at least a part of the gaps g2 between the second heat-dissipation fins 42 from the opposite side of the first main wall 11. In the embodiment, the top plate 51E is provided so as to extend through the entire length of the second heat-dissipation fin 42 in the X direction. In the modified example, the top plate 51E covers the gaps g2 between all of the second heat-dissipation fins 42 from the opposite side of the first main wall 11. The top plate 51E is a member configured to prevent the airflow passing through the gaps g1 between the first heat-dissipation fins 41 from flowing into the gaps g2 between the second heat-dissipation fins 42 from the side in the +Z direction.

In the modified example, since the flow-blocking portion 52E is inclined with respect to the X direction, a space SJ is present between the flow-blocking portion 52E and the end portions 42e1 on the side in the +X direction of the plurality of the second heat-dissipation fins 42. The gaps g2 between the second heat-dissipation fins 42 are in communication with the space SJ in the X direction at the end portions 42e1 on the side in the +X direction of the plurality of the second heat-dissipation fins 42.

An opening portion 65 is defined between the end portion on the side in the +Y direction of the flow-blocking portion 52E and the first main wall 11. The opening portion 65 opens in the +Y direction. The opening portion 65 causes the space SJ to be in communication with the outside. Similarly to the above, an opening portion 66 is defined between the end portion on the side in the −Y direction of the flow-blocking portion 52E and the first main wall 11. The opening portion 66 opens in the −Y direction. The opening portion 66 causes the space SJ to be in communication with the outside. Consequently, the gaps g2 between the second heat-dissipation fins 42 are in communication with the outside via the space SJ and the opening portions 65 and 66.

Figure 13:
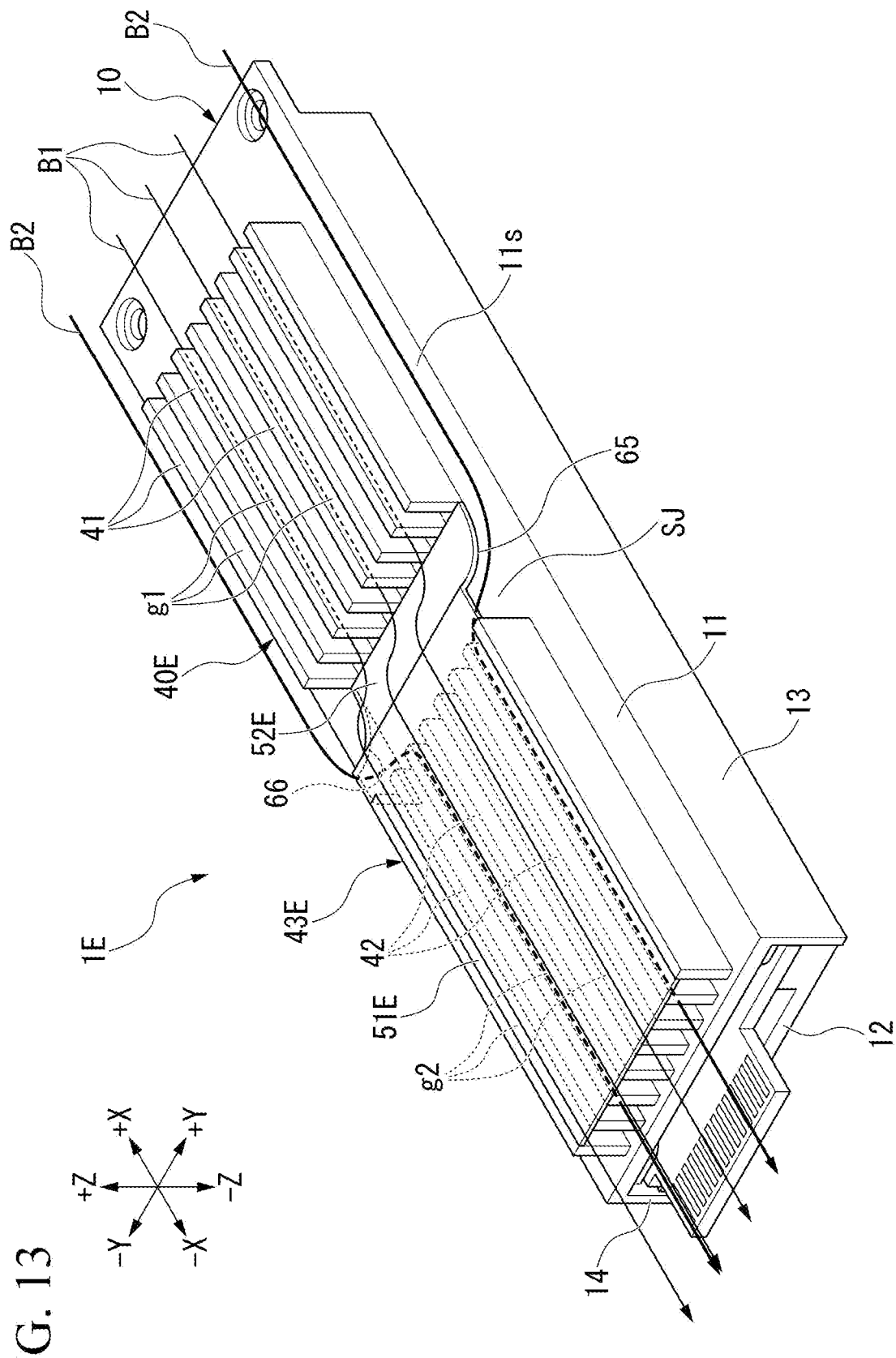
FIG. 13 is an explanatory view showing an action of the semiconductor storage device according to the fifth modified example of the first embodiment.

FIG. 13 is an explanatory perspective view showing an action of the semiconductor storage device 1E.

In FIG. 13, the arrow B1 shown by a fine line represents part of airflow supplied to the periphery of the semiconductor storage device 1E (hereinbelow, referred to as "airflow B1"). The airflow B1 flows into the gaps g1 between the first heat-dissipation fins 41 and flows through the gaps g1 in the −X direction. Consequently, the plurality of the first heat-dissipation fins 41 are cooled down, heat dissipation from the first semiconductor memory components 24A is prompted by the fins.

After the airflow B1 passes through the gaps g1 between the first heat-dissipation fins 41, the airflow B1 is blocked by the flow-blocking portion 52E. The flow direction of the airflow B1 is changed by being blocked by the flow-blocking portion 52E. For example, the flow direction of part of the airflow B1 is changed into other flow directions by being blocked by the flow-blocking portion 52E. The part of the airflow B1 in the changed flow direction moves to the side in the +Z direction along the flow-blocking portion 52E. The airflow B1 moving to the side in the +Z direction flows in the −X direction on the side in the +Z direction with respect to the top plate 51E.

In FIG. 13, the arrow B2 shown by a thick line represents the other part of the airflow supplied to the periphery of the semiconductor storage device 1E (hereinbelow, referred to as "airflow B2"). The airflow B2 flows in the −X direction on the side in the +Y direction or the side in the −Y direction with respect to the plurality of the first heat-dissipation fins 41 (i.e., with respect to the first heat-dissipation fin array). When the airflow B2 reaches the side in the +Y direction or the side in the −Y direction of the flow-blocking portion 52E, the airflow B2 flows into the gaps g2 between the second heat-dissipation fins 42 via the opening portions 65 and 66 and the space SJ. Air flowing into the gaps g2 between the second heat-dissipation fins 42 flows between the top plate 51E and the first main wall 11 in the −X direction, and passes through the gaps g2 between the second heat-dissipation fins 42. Consequently, the plurality of the second heat-dissipation fins 42 are cooled down, and heat dissipation from the controller 23 is prompted by the fins.

With this configuration, by the flow-blocking portion 52E, at least part of the airflow passing through the gaps g1 between the first heat-dissipation fins 41 is prevented from flowing into the gaps g2 between the second heat-dissipation fins 42. Accordingly, heat dissipation of the semiconductor storage device 1E can be improved.

Second Embodiment

Next, a second embodiment will be described. The second embodiment is different from the first embodiment in that the first main wall 11 of the housing 10 has opening portions 81 and 82. Configurations other than those described below are the same as the configurations according to the first embodiment.

Figure 14:
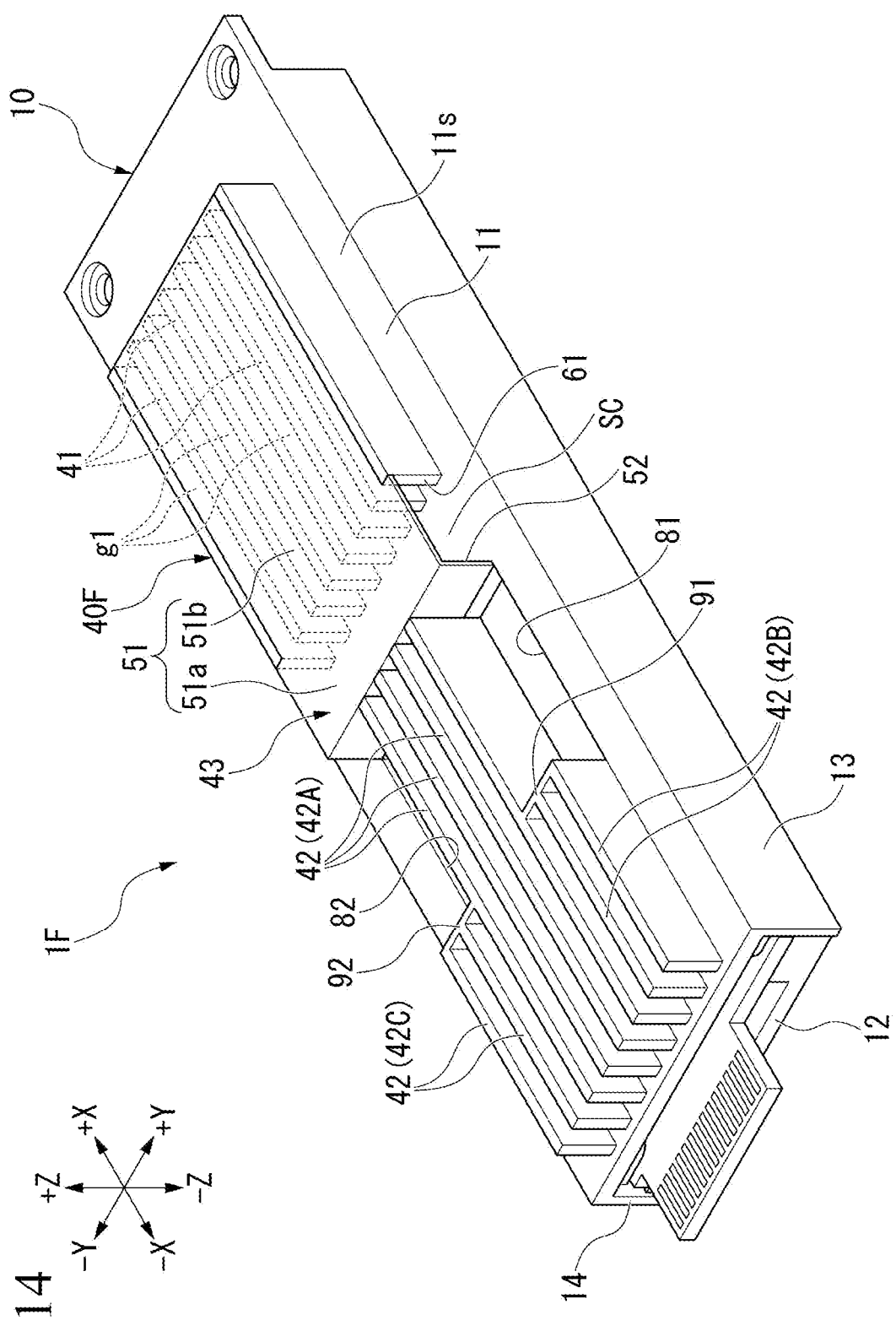
FIG. 14 is a perspective view showing a semiconductor storage device according to a second embodiment.

FIG. 14 is a perspective view showing a semiconductor storage device 1F according to the second embodiment. Similarly to the first embodiment, a heat-dissipation structure 40F of the semiconductor storage device 1F according to the embodiment includes the flow regulation plate 43.

Figure 15:
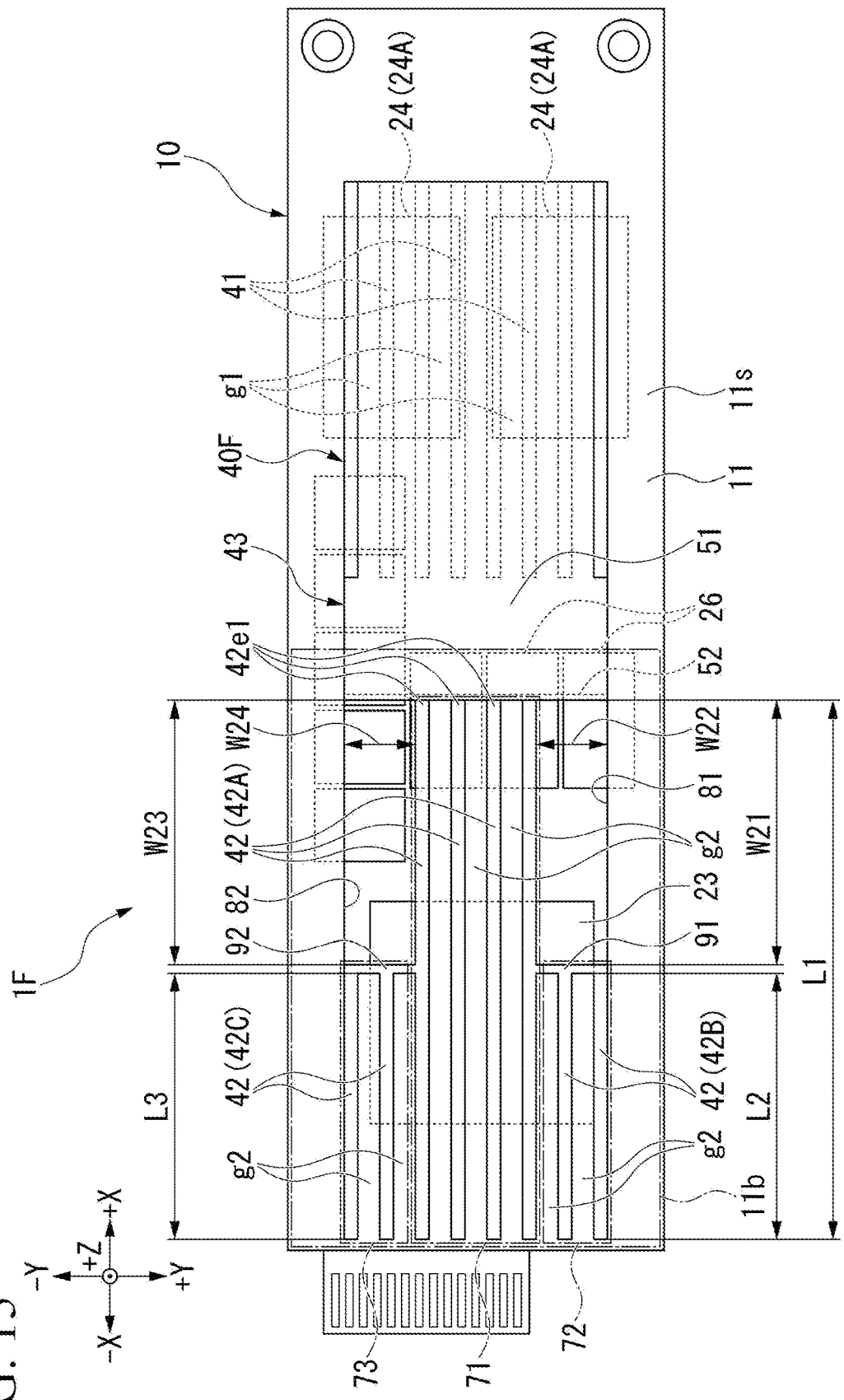
FIG. 15 is a plan view showing the semiconductor storage device according to the second embodiment.

FIG. 15 is a plan view showing the semiconductor storage device 1F. In the embodiment, the second region 11b of the first main wall 11 has a center region 71, a first side region 72, and a second side region 73. The center region 71 is located at the center portion of the second region 11b in the Y direction. The first side region 72 is located at the side in the +Y direction with respect to the center region 71. The second side region 73 is located at the side in the −Y direction with respect to the center region 71.

In the embodiment, the plurality of the second heat-dissipation fins 42 include a plurality of first-length fins 42A, a plurality of second-length fins 42B, and a plurality of third-length fins 42C.

The plurality of the first-length fins 42A are provided on the center region 71. Each of the first-length fins 42A has the first length L1 (first size) in the X direction. The end portions on the side in the +X direction of the plurality of the first-length fins 42A are adjacent to, for example, the flow-blocking portion 52 of the flow regulation plate 43.

The plurality of the second-length fins 42B are provided on the first side region 72. Each of the second-length fins 42B has the second length L2 (second size) in the X direction. The second length L2 is shorter than the first length L1. The end portions on the side in the +X direction of the plurality of the second-length fins 42B are located closer to the side in the −X direction than the end portions on the side in the +X direction of the plurality of the first-length fins 42A. The end portions on the side in the +X direction of the plurality of the second-length fins 42B are apart from the flow-blocking portion 52 of the flow regulation plate 43 in the X direction.

The plurality of the third-length fins 42C are provided on the second side region 73. Each of the third-length fins 42C has the third length L3 (third size) in the X direction. The third length L3 is shorter than the first length L1. The third length L3 is, for example, the same as the second length L2. The end portions on the side in the +X direction of the plurality of the third-length fins 42C are located closer to the side in the −X direction than the end portions on the side in the +X direction of the plurality of the first-length fins 42A. The end portions on the side in the +X direction of the plurality of the third-length fins 42C are apart from the flow-blocking portion 52 of the flow regulation plate 43 in the X direction.

In the embodiment, the second region 11b of the first main wall 11 has the opening portion 81 and the opening portion 82. Each of the opening portion 81 and the opening portion 82 penetrates through the first main wall 11 in the Z direction. Each of the opening portion 81 and the opening portion 82 causes the inside of the housing 10 to be in communication with the outside of the housing 10. Each of the opening portion 81 and the opening portion 82 is a vent hole. Air can flow between the inside and the outside of the housing 10 via the vent hole.

The opening portion 81 is provided on the first side region 72. At least a part of the opening portion 81 is located so as to correspond to a region on the board 21 between the controller 23 and the first semiconductor memory components 24A when viewed from the Z direction. In other words, the region between the controller 23 and the first semiconductor memory components 24A overlaps at least a part of the opening portion 81 in the Z direction. For example, at least a part of the opening portion 81 is located so as to correspond to a region between the controller 23 and the capacitor 26 on the board 21 when viewed from the Z direction. In the embodiment, a part of the opening portion 81 is located so as to correspond to the controller 23 when viewed from the Z direction. The opening portion 81 is an example of a "second opening portion".

In the embodiment, the opening portion 81 is adjacent to the flow-blocking portion 52 of the flow regulation plate 43 in the X direction. When viewed from the Z direction, the opening portion 81 is located between the plurality of the second-length fins 42B and the plurality of the first heat-dissipation fins 41 in the X direction. When viewed from the Z direction, the opening portion 81 is located between the plurality of the second-length fins 42B and the flow-blocking portion 52 of the flow regulation plate 43 in the X direction. The length W21 of the opening portion 81 in the X direction is longer than the length W22 of the opening portion 81 in the Y direction. However, the length W21 of the opening portion 81 in the X direction may be shorter than the length W22 of the opening portion 81 in the Y direction.

The opening portion 82 is provided on the second side region 73. At least a part of the opening portion 82 is located so as to correspond to a region on the board 21 between the controller 23 and the first semiconductor memory components 24A when viewed from the Z direction. In other words, the region between the controller 23 and the first semiconductor memory components 24A overlaps at least a part of the opening portion 82 in the Z direction. For example, at least a part of the opening portion 82 is located so as to correspond to a region between the controller 23 and the capacitor 26 on the board 21 when viewed from the Z direction. In the embodiment, a part of the opening portion 82 is located so as to correspond to the controller 23 when viewed from the Z direction.

In the embodiment, the opening portion 82 is adjacent to the flow-blocking portion 52 of the flow regulation plate 43 in the X direction. When viewed from the Z direction, the opening portion 82 is located between the plurality of the third-length fins 42C and the plurality of the first heat-dissipation fins 41 in the X direction. When viewed from the Z direction, the opening portion 82 is located between the plurality of the third-length fins 42C and the flow-blocking portion 52 of the flow regulation plate 43 in the X direction. The length W23 of the opening portion 82 in the X direction is longer than the length W24 of the opening portion 82 in the Y direction. However, the length W23 of the opening portion 82 in the X direction may be shorter than the length W24 of the opening portion 82 in the Y direction.

In the second embodiment, the heat-dissipation structure 40F includes a first wall portion 91 and a second wall portion 92.

The first wall portion 91 is provided at the end portions on the side in the +X direction of the plurality of the second-length fins 42B. When viewed from the X direction, the first wall portion 91 covers at least a part of the gap g2 between the second-length fins 42B. In the present application, "covers at least a part of the gap between the second-length fins" is not limited to covering at least a part of each of the gaps between all of the second-length fins, but may also include a case of covering at least a part (for example, a part in the Z direction or a part in the Y direction) of each of the gaps between some heat-dissipation fins included in the above-mentioned second-length fins. In the embodiment, the first wall portion 91 covers the gaps g2 between all of the second-length fins 42B when viewed from the X direction. Note that, contact of the first wall portion 91 and the plurality of the second-length fins 42B is not essential. The first wall portion 91 may be disposed separately from the plurality of the second-length fins 42B in the +X direction. The first wall portion 91 is an example of a "fourth cover portion".

Similarly to the above, the second wall portion 92 is provided at the end portions on the side in the +X direction of the plurality of the third-length fins 42C. When viewed from the X direction, the second wall portion 92 covers at least a part of the gap g2 between the third-length fins 42C. In the embodiment, the second wall portion 92 covers the gaps g2 between all of the third-length fins 42C when viewed from the X direction. Note that, contact of the second wall portion 92 and the plurality of the third-length fins 42C is not essential. The second wall portion 92 may be disposed separately from the plurality of the third-length fins 42C in the +X direction.

<Actions>

Figure 16:
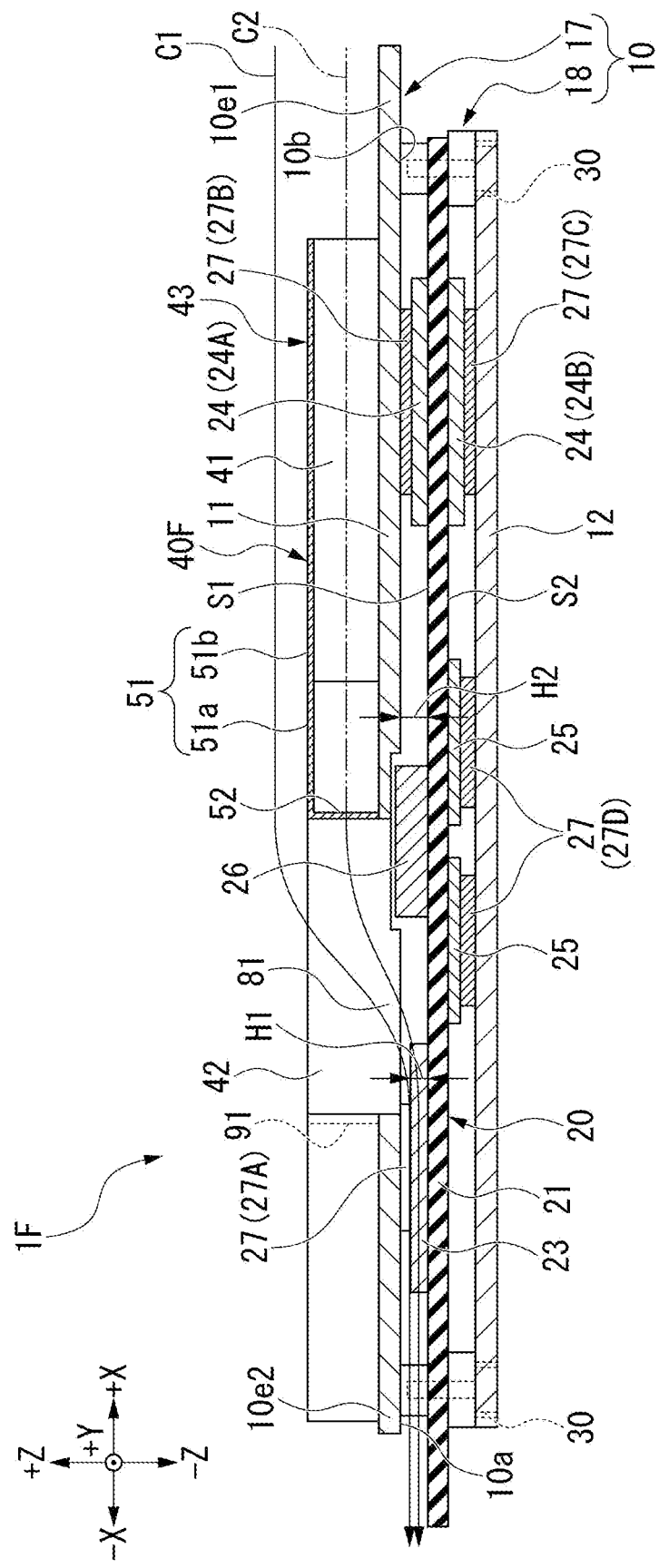
FIG. 16 is an explanatory view showing an action of the semiconductor storage device according to the second embodiment.

FIG. 16 is an explanatory cross-sectional view showing an action of the semiconductor storage device 1F. In the embodiment, the opening portion 81 and the opening portion 82 are provided on the first main wall 11. As shown in FIG. 16, the arrow C1 shown by a fine line represents part of the air flowing in the outside of the housing 10 (hereinbelow, referred to as "airflow C1"). The airflow C1 flows into the inside of the housing 10 via the opening portion 81 or the opening portion 82. In contrast, the arrow C2 shown by a two-dot chain line represents part of the air flowing into the gaps g1 between the first heat-dissipation fins 41 (hereinbelow, referred to as "airflow C2"). The airflow C1 passes through the periphery of the controller 23 and flows out from the opening portion 10a of the second end portion 10e2 of the housing 10 to the outside of the housing 10. For this reason, the controller 23 is cooled down.

In the embodiment, since the flow regulation plate 43 including the flow-blocking portion 52 is provided in the semiconductor storage device 1F, the airflow C2 that has passed through the gaps g1 between the first heat-dissipation fins 41 is changed into the Y direction by the flow-blocking portion 52. Accordingly, it is difficult for the airflow C2 to flow into the inside of the housing 10 through the opening portion 81 or the opening portion 82. On the other hand, the cold airflow C1 that has flowed in the outside of the plurality of the first heat-dissipation fins 41 flows into the inside of the housing 10 via the opening portion 81 or the opening portion 82. The cold airflow C1 passes through the periphery of the controller 23. Accordingly, the controller 23 is cooled down.

In the embodiment, the capacitor 26 is a component having a relatively high height from the first surface S1 of the board 21. The mounting height H2 of the capacitor 26 with respect to the first surface S1 of the board 21 is higher than the mounting height H1 of the controller 23 with respect to the first surface S1 of the board 21. For this reason, even in the semiconductor storage device 1F having the opening portion 10b at which the first end portion 10e1 of the housing 10 opens to the outside, it may be difficult for air flowing into the inside from the first end portion 10e1 of the housing 10 to reach the controller 23. However, in the embodiment, part of the air (airflow C1) flowing in the outside of the housing 10 flows into the inside of the housing 10 via the opening portion 81 or the opening portion 82 and passes through the periphery of the controller 23. As a result, the controller 23 is cooled down.

<Advantages>

In the embodiment, the housing 10 has the opening portions 81 and 82. Each of the opening portions 81 and 82 opens in the Z direction and causes the inside of the housing 10 to be in communication with the outside of the housing 10. At least a part of the opening portion 81 is located so as to correspond to a region on the board 21 between the controller 23 and the first semiconductor memory components 24A when viewed from the Z direction. At least a part of the opening portion 82 is located so as to correspond to a region on the board 21 between the controller 23 and the first semiconductor memory components 24A when viewed from the Z direction. With this configuration, it is possible to guide outside air of the housing 10 to the controller 23. Accordingly, it is possible to directly cool down the controller 23, and heat dissipation of the controller 23 is further prompted.

In the embodiment, the plurality of the second heat-dissipation fins 42 includes the plurality of the first-length fins 42A, the plurality of the second-length fins 42B, and the plurality of the third-length fins 42C. Each of the first-length fins 42A has the first length L1 in the X direction. Each of the second-length fins 42B has the second length L2 in the X direction. Each of the third-length fins 42C has the third length L3 in the X direction. The second length L2 is shorter than the first length L1. The third length L3 is shorter than the first length L1. When viewed from the Z direction, the opening portion 81 is located between the plurality of the second-length fins 42B and the plurality of the first heat-dissipation fins 41, and the opening portion 82 is located between the plurality of the third-length fins 42C and the plurality of the first heat-dissipation fins 41. With this configuration, it is possible to increase the heat dissipation surface area of the second heat-dissipation fins 42 on a region overlapping the controller 23. Therefore, heat dissipation of the controller 23 is further prompted.

In the embodiment, the plurality of the first-length fins 42A are arranged on a region overlapping the controller 23 in the Z direction. Consequently, part of heat generated in the controller 23 is transferred to the plurality of the first-length fins 42A via the first heat connection member 27A and is dissipated via the plurality of the first-length fins 42A. Accordingly, heat dissipation of the controller 23 is further prompted.

In the embodiment, the heat-dissipation structure 40F includes the first wall portion 91 that covers at least a part of the gap g2 between the second-length fins 42B when viewed from the X direction. The heat-dissipation structure 40F includes the second wall portion 92 that covers at least a part of the gap g2 between the third-length fins 42C when viewed from the X direction. With this configuration, part of the air flowing around the semiconductor storage device 1F is blocked by the first wall portion 91 and is likely to flow into the inside of the housing 10 through the opening portion 81. Similarly, part of the air flowing around the semiconductor storage device 1F is blocked by the second wall portion 92 and is likely to flow into the inside of the housing 10 through the opening portion 82. Accordingly, heat dissipation of the semiconductor storage device 1F can be further improved.

Modified Examples

Next, some modified examples according to the second embodiment will be described. Configurations of each modified example other than those described below are the same as the configurations according to the second embodiment.

First Modified Example

Figure 17:
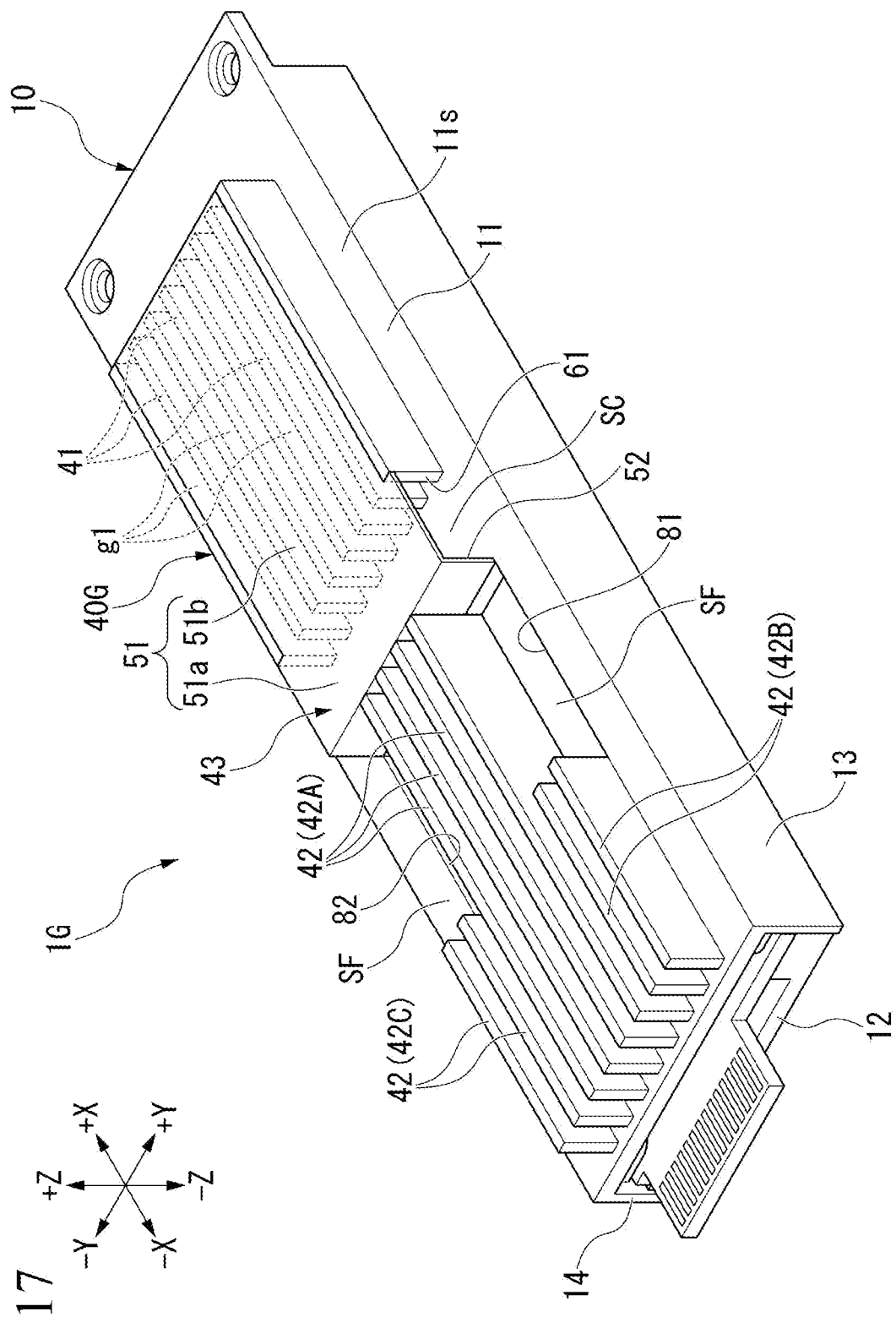
FIG. 17 is a perspective view showing a semiconductor storage device according to a first modified example of the second embodiment.

FIG. 17 is a perspective view showing a semiconductor storage device 1G according to a first modified example. A heat-dissipation structure 40G of the semiconductor storage device 1G according to the first modified example does not include the first wall portion 91 and the second wall portion 92. The gap g2 between the second-length fins 42B opens in the +X direction at the end portions on the side in the +X direction of the plurality of the second-length fins 42B. In the modified example, the space SF is present between the flow-blocking portion 52 and the end portions on the side in the +X direction of the plurality of the second-length fins 42B. The gap g2 between the second-length fins 42B is in communication with the space SF.

Similarly, the gap g2 between the third-length fins 42C opens in the +X direction at the end portions on the side in the +X direction of the plurality of the third-length fins 42C. In the modified example, the space SF is present between the flow-blocking portion 52 and the end portions on the side in the +X direction of the plurality of the third-length fins 42C. The gap g2 between the third-length fins 42C is in communication with the space SF.

With this configuration, part of the air flowing around the semiconductor storage device 1G easily flows into the gap g2 from the end portions on the side in the +X direction of the plurality of the second-length fins 42B. Accordingly, heat dissipation of the controller 23 is likely to be prompted, and heat dissipation of the semiconductor storage device 1F can be further improved.

Second Modified Example

Figure 18:
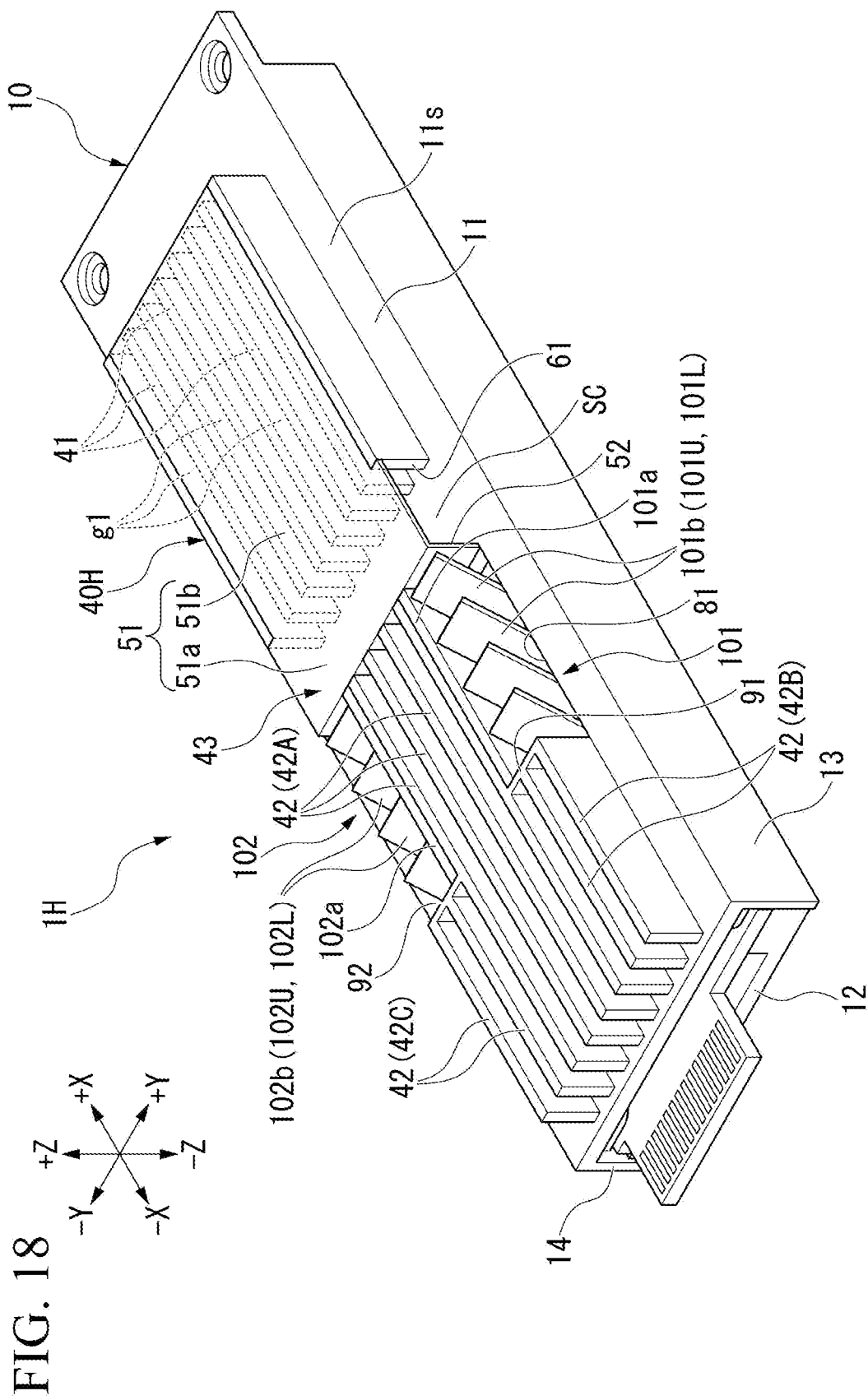
FIG. 18 is a perspective view showing a semiconductor storage device according to a second modified example of the second embodiment.

FIG. 18 is a perspective view showing a semiconductor storage device 1H according to a second modified example. A heat-dissipation structure 40H of the semiconductor storage device 1H according to the second modified example includes a first air guide portion 101 and a second air guide portion 102.

The first air guide portion 101 is provided outside the housing 10. The first air guide portion 101 includes a support plate 101a and a plurality of inclined plates 101b supported by the support plate 101a. The support plate 101a is attached to the second heat-dissipation fin 42 or the housing 10. The plurality of the inclined plates 101b are arranged so as to align in the X direction. The plurality of the inclined plates 101b overlap the opening portion 81 in the Z direction. Each of the inclined plates 101b is inclined with respect to the X direction such that, as the inclined plate 101b gradually approaches the end portion on the side in the −X direction, the inclined plate 101b gradually approaches the end portion on the side in the −Z direction. In other words, the inclined plate 101b has an upper end 101U and a lower end 101L. The upper end 101U is an end of the inclined plate 101b in the +Z direction and the +X direction. The lower end 101L is an end of the inclined plate 101b in the −Z direction and the −X direction. The inclined plate 101b is inclined with respect to the X direction so as to extend from the upper end 101U to the lower end 101L. Part of the air flowing in the outside of the housing 10 in the X direction is blocked by each of the inclined plates 101b. Consequently, the flow direction of the part of the air flowing in the outside of the housing 10 is changed into the direction toward the opening portion 81.

Similarly, the second air guide portion 102 is provided outside the housing 10. The second air guide portion 102 includes a support plate 102a and a plurality of inclined plates 102b supported by the support plate 102a. The support plate 102a is attached to the second heat-dissipation fin 42 or the housing 10. The plurality of the inclined plates 102b are arranged so as to align in the X direction. The plurality of the inclined plates 102b overlap the opening portion 82 in the Z direction. Each of the inclined plates 102b is inclined with respect to the X direction such that, as the inclined plate 102b gradually approaches the end portion on the side in the −X direction, the inclined plate 102b gradually approaches the end portion on the side in the −Z direction. In other words, the inclined plate 102b has an upper end 102U and a lower end 102L. The upper end 102U is an end of the inclined plate 102b in the +Z direction and the +X direction. The lower end 102L is an end of the inclined plate 102b in the −Z direction and the −X direction. The inclined plate 102b is inclined with respect to the X direction so as to extend from the upper end 102U to the lower end 102L. Part of the air flowing in the outside of the housing 10 in the X direction is blocked by each of the inclined plates 102b. Consequently, the flow direction of the part of the air flowing in the outside of the housing 10 is changed into the direction toward the opening portion 82.

<Actions>

Figure 19:
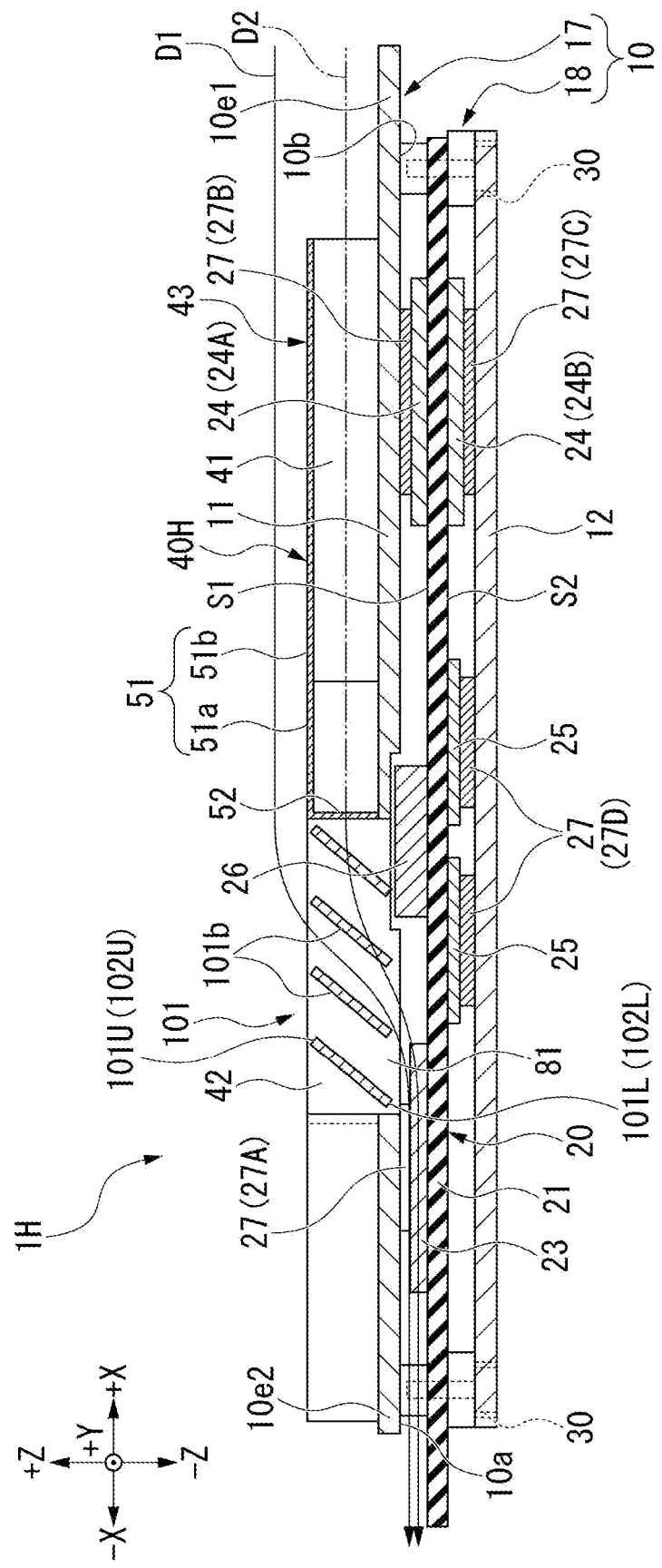
FIG. 19 is an explanatory view showing an action of the semiconductor storage device according to the second modified example of the second embodiment.

FIG. 19 is an explanatory view showing an action of the semiconductor storage device 1H. As shown in FIG. 19, the arrow D1 shown by a fine line represents part of the air flowing in the outside of the housing 10 (hereinbelow, referred to as "airflow D1"). The airflow D1 is blocked by the inclined plate 101b of the first air guide portion 101 or the inclined plate 102b of the second air guide portion 102 and therefore the airflow D1 becomes the airflow directed to the side in the −Z direction. Accordingly, the airflow D1 flows into the inside of the housing 10 via the opening portion 81 or the opening portion 82. In contrast, the arrow D2 shown by a two-dot chain line represents part of the air flowing into the gaps g1 between the first heat-dissipation fins 41 (hereinbelow, referred to as "airflow D2"). The airflow D1 passes through the periphery of the controller 23 and flows out from the opening portion 10a of the second end portion 10e2 of the housing 10 to the outside of the housing 10. Accordingly, the controller 23 is cooled down.

<Advantages>

In the embodiment, the heat-dissipation structure 40H includes the inclined plates 101b and 102b. Each inclined plate 101b overlaps the opening portion 81 in the Z direction. Each inclined plate 101b is inclined with respect to the X direction such that, as the inclined plate 101b gradually approaches the end portion on the side in the −X direction, the inclined plate 101b gradually approaches the opening portion 81. Each inclined plate 102b overlaps the opening portion 82 in the Z direction. Each inclined plate 102b is inclined with respect to the X direction such that, as the inclined plate 102b gradually approaches the end portion on the side in the −X direction, the inclined plate 102b gradually approaches the opening portion 82. With this configuration, since part of the air flowing in the outside of the housing 10 is blocked by the inclined plates 101b or 102b, it is possible to increase an amount of air flowing into the inside of the housing 10. Consequently, heat dissipation of the controller 23 can be further prompted. Furthermore, since the plurality of the inclined plates 101b and 102b are provided, dust is less likely to enter the inside of the housing 10 via the opening portions 81 and 82.

While some embodiments and modified examples have been described above, the embodiments and the modified examples are not limited to the above examples. For example, the embodiments and the modified examples described above may be realized by a combination thereof.

According to at least one of the embodiments described above, the heat-dissipation structure includes a plurality of first heat-dissipation fins, a plurality of second heat-dissipation fins, and a first cover portion. Each of the plurality of the first heat-dissipation fins extends in a second direction. The plurality of the second heat-dissipation fins are apart from the plurality of the first heat-dissipation fins in the second direction. Each of the plurality of the second heat-dissipation fins extends in the second direction. The first cover portion is disposed between the plurality of the first heat-dissipation fins and the plurality of the second heat-dissipation fins, or the first cover portion is disposed at a gap between the second heat-dissipation fins. The first cover portion covers at least a part of the gap between the second heat-dissipation fins when viewed from the second direction. With this configuration, it is possible to improve heat dissipation of the semiconductor storage device.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor storage device comprising:
a housing;
a board in the housing;
a semiconductor memory component on the board;
a controller on the board, the controller being configured to control the semiconductor memory component; and
a heat-dissipation structure on the housing, the heat-dissipation structure being exposed to an outside of the housing, wherein
the housing has a first region and a second region, the first region overlaps the semiconductor memory component in a first direction, the first direction being a thickness direction of the board, the second region overlaps the controller in the first direction,
the heat-dissipation structure includes a plurality of first heat-dissipation fins, a plurality of second heat-dissipation fins, and a first cover portion,
the plurality of the first heat-dissipation fins are on the first region,
each of the plurality of the first heat-dissipation fins extends in a second direction, the second direction being a direction from the semiconductor memory component to the controller,
the plurality of the second heat-dissipation fins are on the second region,
the plurality of the second heat-dissipation fins are apart from the plurality of the first heat-dissipation fins in the second direction,
each of the plurality of the second heat-dissipation fins extends in the second direction,
the first cover portion is between the plurality of the first heat-dissipation fins and the plurality of the second heat-dissipation fins, or the first cover portion is at a gap between the second heat-dissipation fins, and
the first cover portion covers at least a part of the gap between the second heat-dissipation fins when viewed from the second direction.

2. The semiconductor storage device according to claim 1, wherein
the heat-dissipation structure further includes a second cover portion, and
the second cover portion covers, from an opposite side of the housing, at least a part of a space between the first heat-dissipation fins and the plurality of the second heat-dissipation fins.

3. The semiconductor storage device according to claim 2, wherein
the second cover portion is connected to the first cover portion.

4. The semiconductor storage device according to claim 2, wherein
the heat-dissipation structure includes a first opening portion between the second cover portion and the housing, and
the first opening portion opens in a third direction, the third direction being a direction crossing the first direction and the second direction.

5. The semiconductor storage device according to claim 2, wherein
the heat-dissipation structure further includes a third cover portion, and
the third cover portion covers, from the opposite side of the housing, at least a part of a gap between the first heat-dissipation fins.

6. The semiconductor storage device according to claim 5, wherein
the third cover portion is connected to the second cover portion.

7. The semiconductor storage device according to claim 1, wherein
the plurality of the second heat-dissipation fins have end portions facing the plurality of the first heat-dissipation fins, and
the first cover portion is adjacent to the end portions of the plurality of the second heat-dissipation fins.

8. The semiconductor storage device according to claim 1, wherein
the first cover portion is apart from the plurality of the second heat-dissipation fins in the second direction, and
the gap between the second heat-dissipation fins is in communication with a space between the plurality of the second heat-dissipation fins and the first cover portion in the second direction.

9. The semiconductor storage device according to claim 1, wherein
the housing includes a second opening portion that opens in the first direction,
the second opening portion causes an inside of the housing to be in communication with the outside of the housing, and
at least a part of the second opening portion corresponds to a region between the controller and the semiconductor memory component on the board when viewed from the first direction.

10. The semiconductor storage device according to claim 9, wherein
the plurality of the second heat-dissipation fins include a plurality of first-length fins and a plurality of second-length fins,
each of the plurality of the first-length fins has a first length in the second direction,
each of the plurality of the second-length fins has a second length shorter than the first length in the second direction, and
the second opening portion is between the plurality of the second-length fins and the plurality of the first heat-dissipation fins when viewed from the first direction.

11. The semiconductor storage device according to claim 10, wherein
the second opening portion is between the plurality of the second-length fins and the first cover portion when viewed from the first direction.

12. The semiconductor storage device according to claim 10, wherein
the heat-dissipation structure further includes a fourth cover portion, and
the fourth cover portion covers at least a part of a gap between the second-length fins when viewed from the second direction.

13. The semiconductor storage device according to claim 10, wherein
a gap between the second-length fins is in communication with a space between the plurality of the second-length fins and the first cover portion in the second direction.

14. The semiconductor storage device according to claim 9, wherein the heat-dissipation structure further includes an inclined plate, the inclined plate overlaps the second opening portion in the first direction, and the inclined plate is inclined such that, as the inclined plate gradually approaches an end portion on a side in the second direction, the inclined plate gradually approaches the second opening portion.

15. The semiconductor storage device according to claim 9, wherein the heat-dissipation structure further includes an inclined plate, the inclined plate has an upper end and a lower end, and the inclined plate is inclined with respect to the second direction so as to extend from the upper end to the lower end.

16. A semiconductor storage device comprising:

a housing;

a board in the housing;

a semiconductor memory component on the board;

a controller on the board, the controller being configured to control the semiconductor memory component; and a heat-dissipation structure on the housing, the heat-dissipation structure being exposed to an outside of the housing, wherein the housing has a first region and a second region, the first region overlaps the semiconductor memory component in a first direction, the first direction is a thickness direction of the board, the second region overlaps the controller in the first direction, the heat-dissipation structure includes a plurality of first heat-dissipation fins and a plurality of second heat-dissipation fins, the plurality of the first heat-dissipation fins are on the first region, each of the plurality of the first heat-dissipation fins extends in a second direction, the second direction being a direction from the semiconductor memory component to the controller, the plurality of the second heat-dissipation fins are on the second region, the plurality of the second heat-dissipation fins are apart from the plurality of the first heat-dissipation fins, each of the plurality of the second heat-dissipation fins extends in the second direction, the housing includes an opening portion, the opening portion opens in the first direction, and at least a part of the opening portion corresponds to a region between the controller and the semiconductor memory component on the board when viewed from the first direction.

17. The semiconductor storage device according to claim 16, wherein the plurality of the second heat-dissipation fins include a plurality of first-length fins and a plurality of second-length fins, each of the plurality of the first-length fins has a first length in the second direction, each of the plurality of the second-length fins has a second length shorter than the first length in the second direction, and the opening portion is between the plurality of the second-length fins and the plurality of the first heat-dissipation fins when viewed from the first direction.

* * * * *